(12) United States Patent
Tange et al.

(10) Patent No.: US 12,126,142 B2
(45) Date of Patent: Oct. 22, 2024

(54) NITRIDE SEMICONDUCTOR LASER DEVICE AND METHOD OF MANUFACTURING NITRIDE SEMICONDUCTOR LASER DEVICE

(71) Applicants: SONY GROUP CORPORATION, Tokyo (JP); SONY SEMICONDUCTOR SOLUTIONS CORPORATION, Kanagawa (JP)

(72) Inventors: Takashi Tange, Kanagawa (JP); Kunihiko Tasai, Tokyo (JP); Kota Tokuda, Kanagawa (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 744 days.

(21) Appl. No.: 17/292,975

(22) PCT Filed: Oct. 25, 2019

(86) PCT No.: PCT/JP2019/041860
§ 371 (c)(1),
(2) Date: May 11, 2021

(87) PCT Pub. No.: WO2020/105362
PCT Pub. Date: May 28, 2020

(65) Prior Publication Data
US 2022/0006265 A1 Jan. 6, 2022

(30) Foreign Application Priority Data
Nov. 20, 2018 (JP) .................... 2018-216957

(51) Int. Cl.
*H01S 5/343* (2006.01)
*H01S 5/042* (2006.01)
*H01S 5/22* (2006.01)

(52) U.S. Cl.
CPC ...... *H01S 5/34333* (2013.01); *H01S 5/04252* (2019.08); *H01S 5/22* (2013.01)

(58) Field of Classification Search
CPC .... H01S 5/0207; H01S 5/341; H01S 5/34333; H01S 5/04252
See application file for complete search history.

(56) References Cited

U.S. PATENT DOCUMENTS 10,096,975 B1 * 10/2018 Leobandung ......... H01S 5/0424
2014/0312301 A1 10/2014 Brandt et al.

FOREIGN PATENT DOCUMENTS

DE 102011118273 A 5/2013
EP 2777078 A1 9/2014
(Continued)

OTHER PUBLICATIONS

International Search Report and Written Opinion of PCT Application No. PCT/JP2019/041860, issued on Dec. 24, 2019, 10 pages of ISRWO.

*Primary Examiner* — Michael Carter
(74) *Attorney, Agent, or Firm* — CHIP LAW GROUP

(57) ABSTRACT

A nitride semiconductor laser device of one embodiment of the present disclosure includes a single-crystal substrate, a base layer, a sheet-shaped structure, a light emitting layer, and a resonator mirror. The single-crystal substrate extends in one direction. The base layer is provided on the single-crystal substrate and includes a nitride semiconductor. The sheet-shaped structure is provided on the base layer to stand in a direction perpendicular to the base layer. The sheet-shaped structure has an area of a side surface that is greater than an area of an upper surface. The side surface extends in (Continued)

a longitudinal direction of the single-crystal substrate. The sheet-shaped structure includes a nitride semiconductor. The light emitting layer is provided at least on the side surface of the sheet-shaped structure. The light emitting layer includes a nitride semiconductor. The resonator mirror is provided by a pair of end surfaces of the sheet-shaped structure that oppose each other in the longitudinal direction.

19 Claims, 24 Drawing Sheets

(56) References Cited

FOREIGN PATENT DOCUMENTS

| | | | |
|---|---|---|---|
| JP | 10-215029 A | | 8/1998 |
| JP | 2009-059740 A | | 3/2009 |
| JP | 2009059740 | * | 3/2009 |
| KR | 10-2011-0117856 A | | 10/2011 |
| WO | 2009/069286 A1 | | 6/2009 |
| WO | 2013/068125 A1 | | 5/2013 |

* cited by examiner

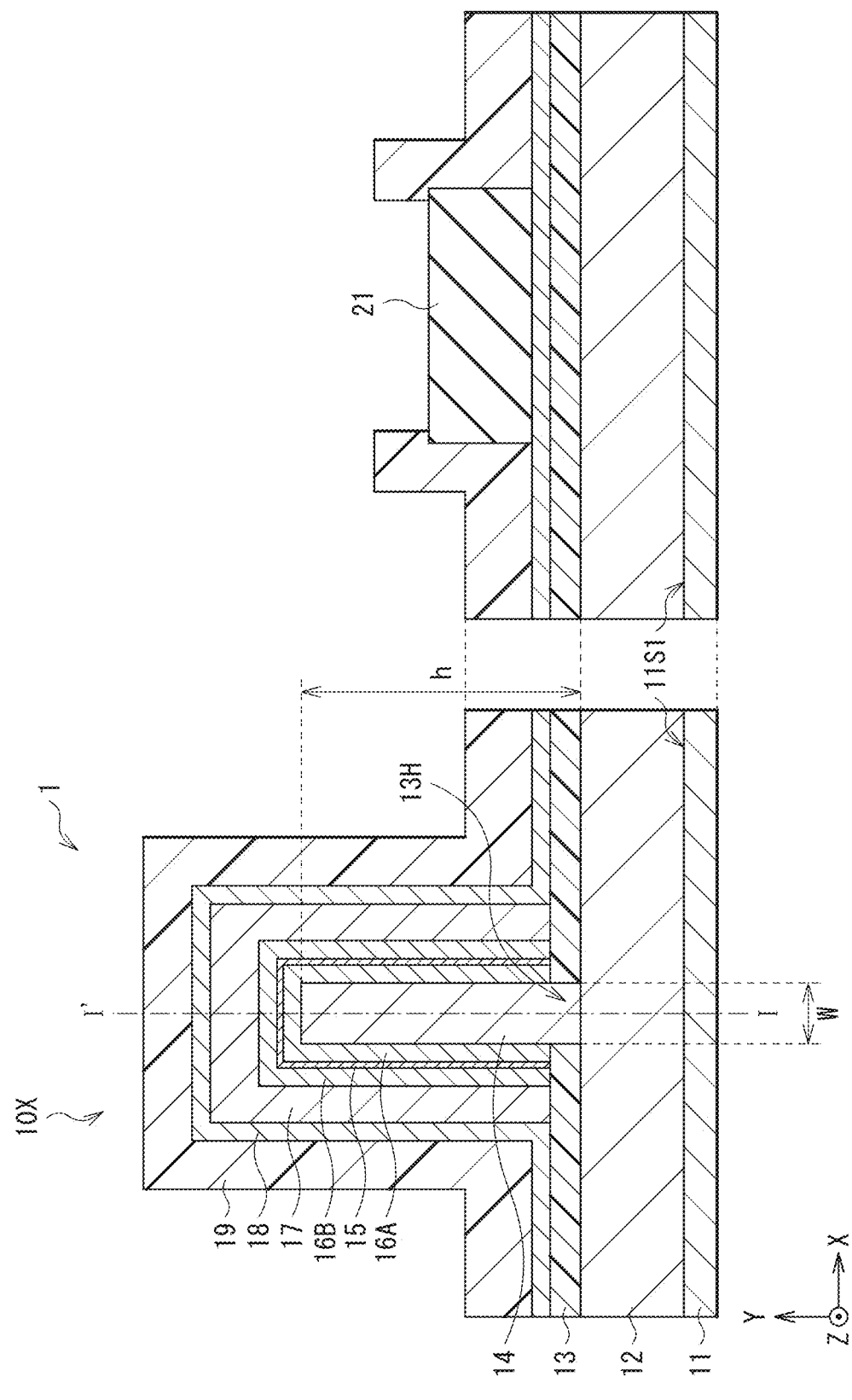
[FIG. 1]

[FIG. 2]
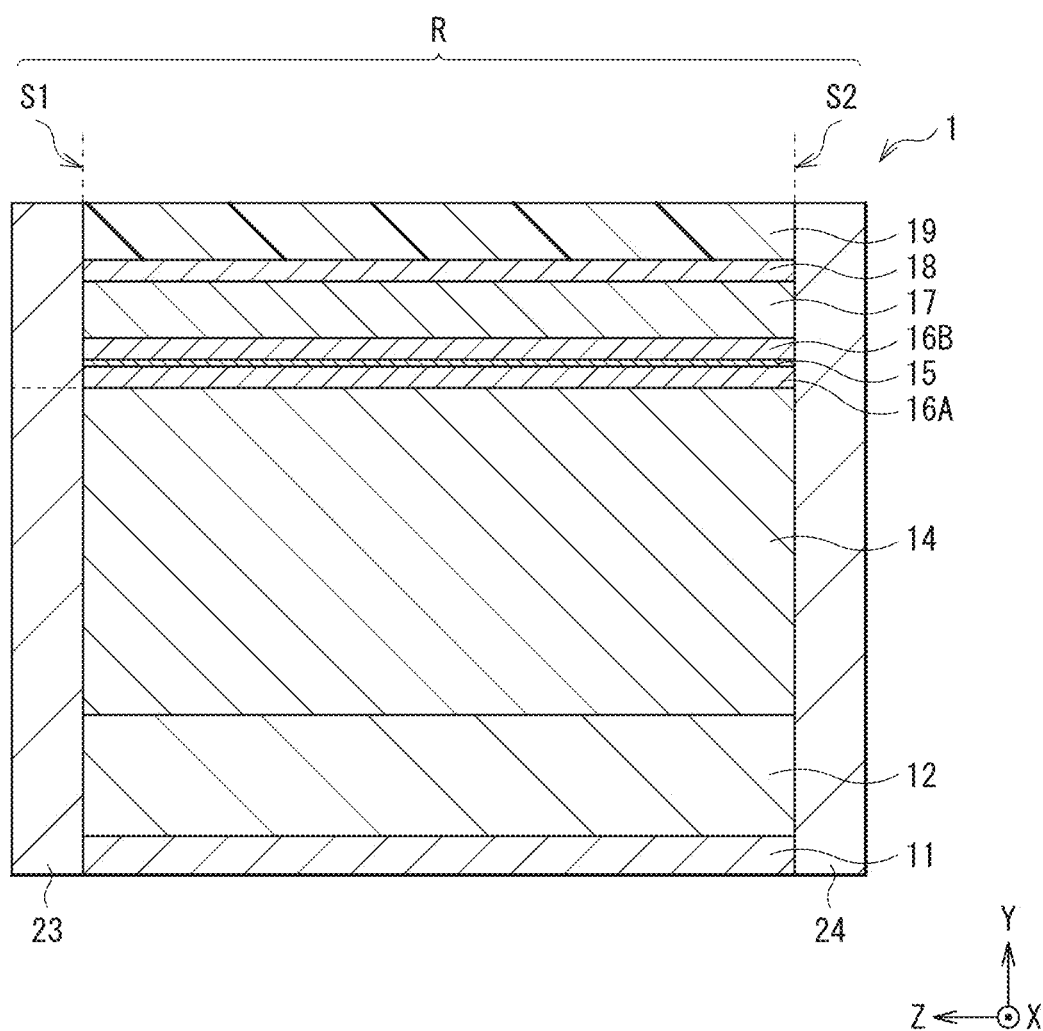

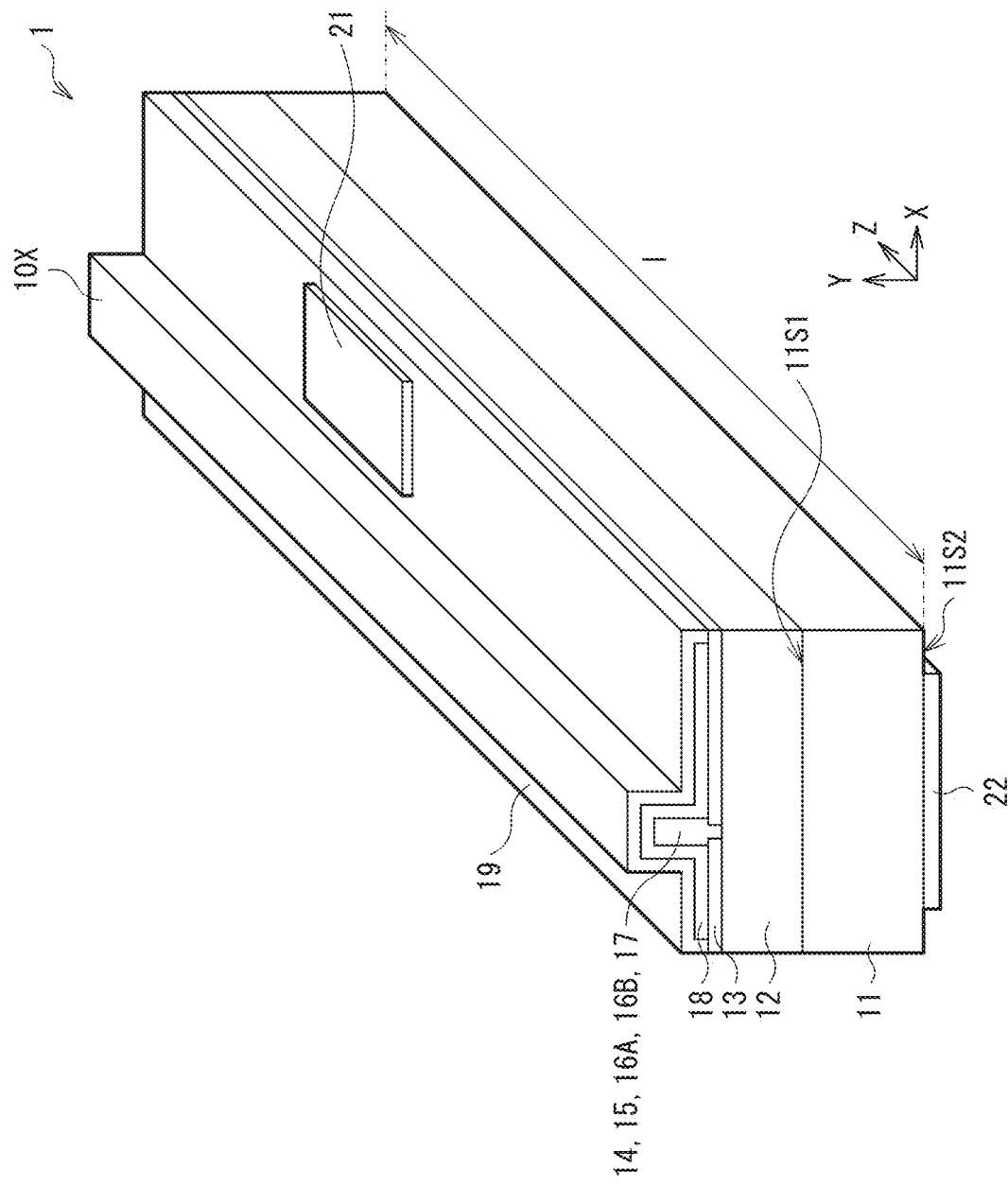
[FIG. 3]

[FIG. 4A]
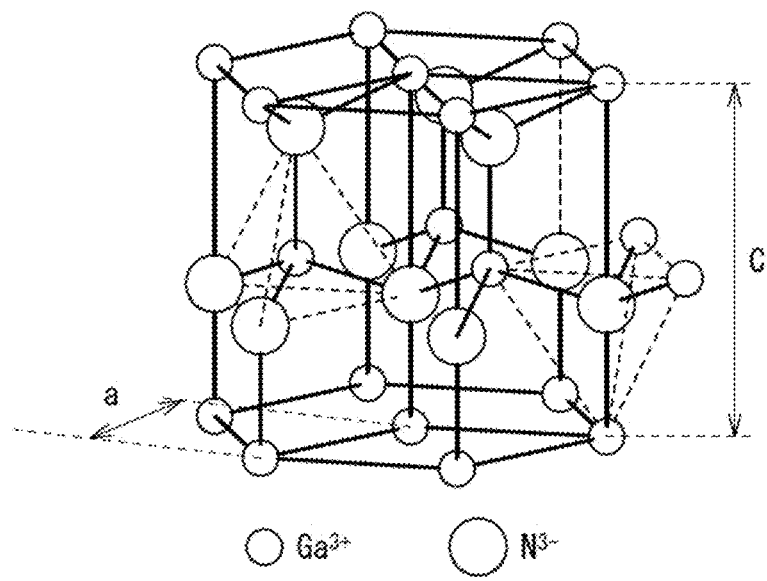
[FIG. 4B]
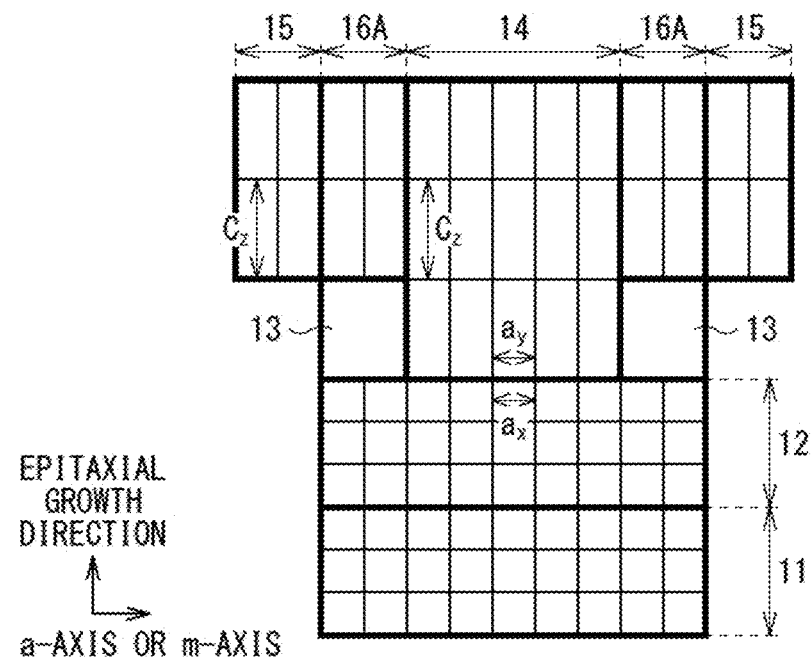

[FIG. 5A]
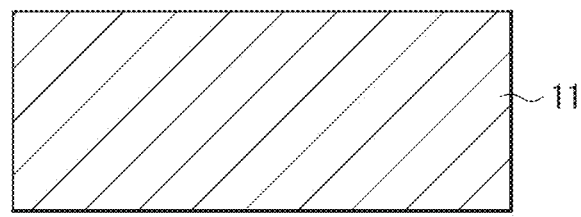
[FIG. 5B]
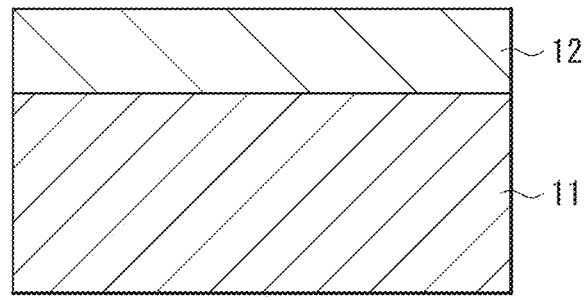
[FIG. 5C]
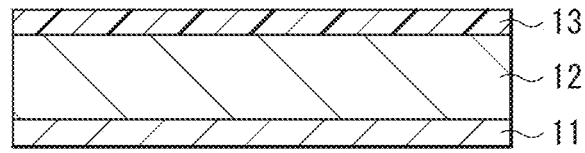
[FIG. 5D]
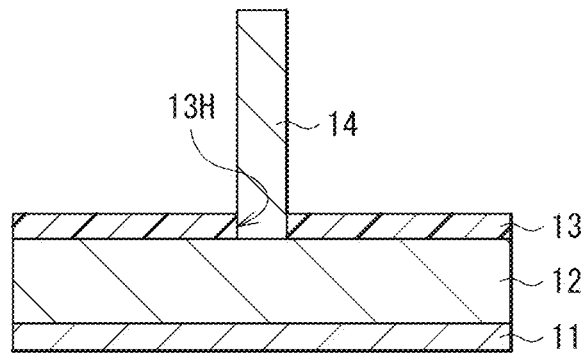

[FIG. 5E]
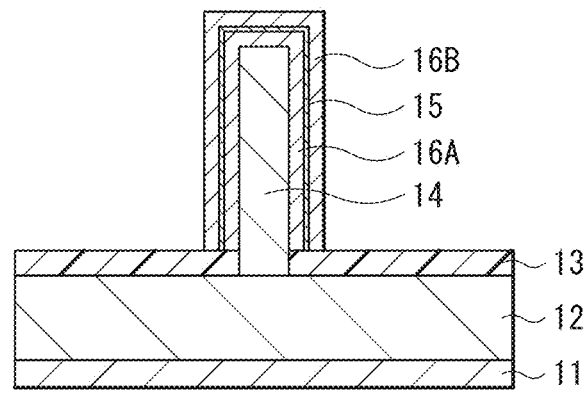
[FIG. 5F]
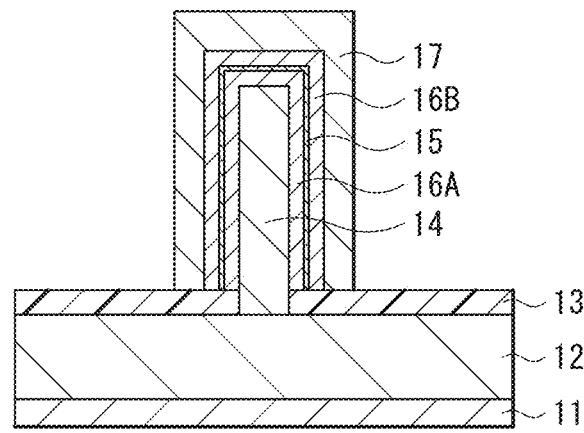
[FIG. 5G]
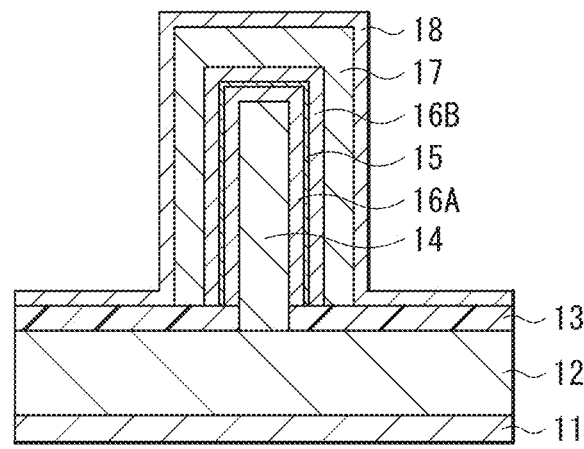

[FIG. 6]
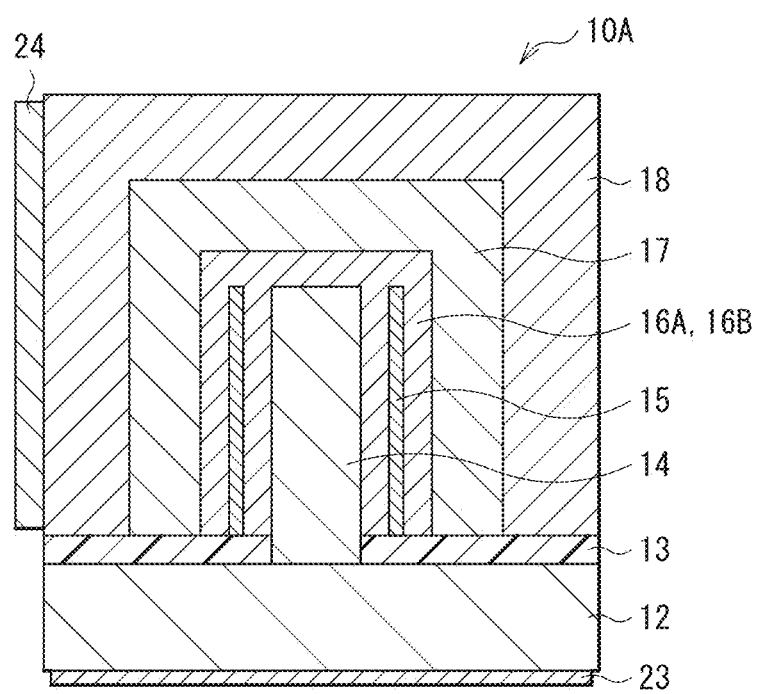

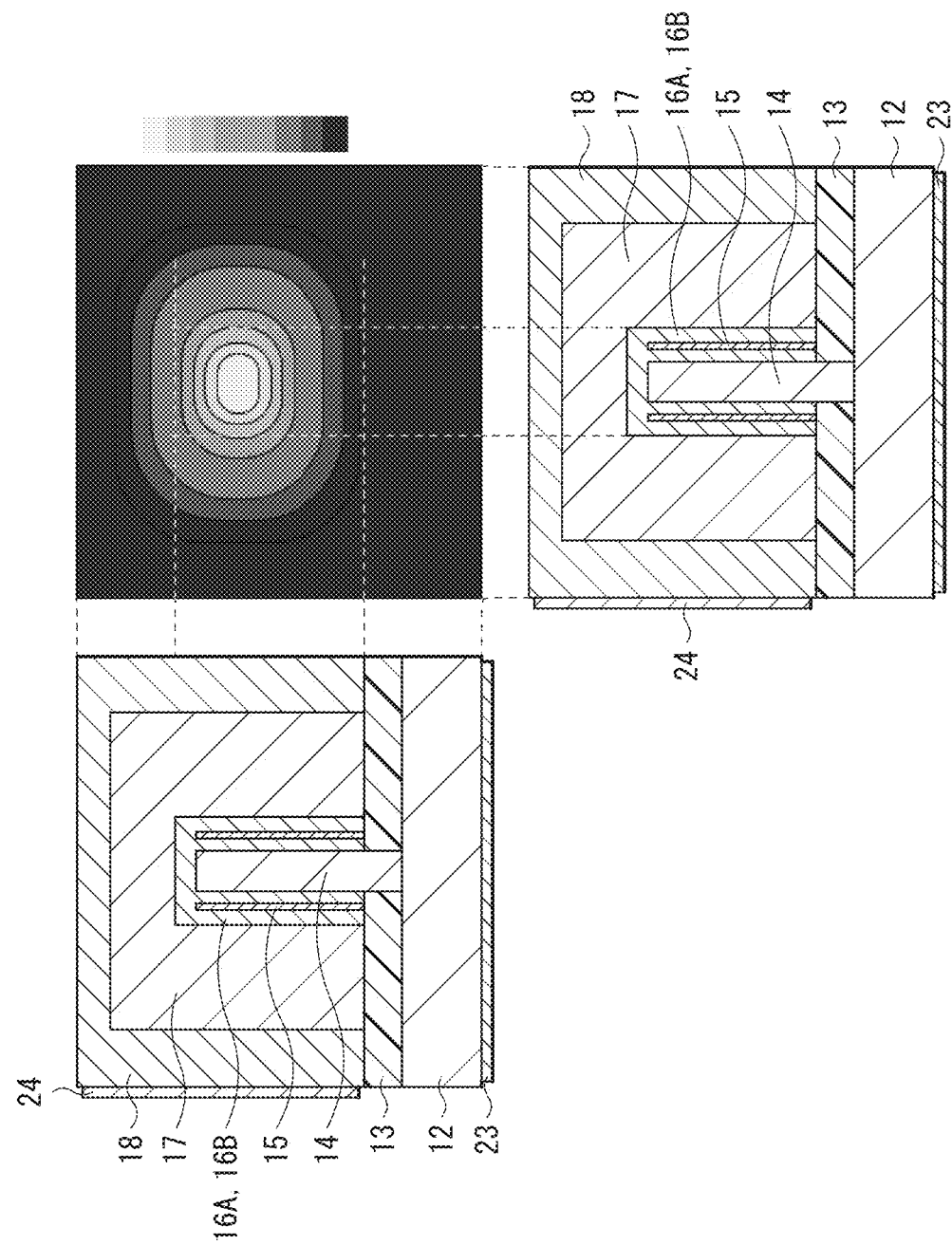
[FIG. 7]

[FIG. 8]
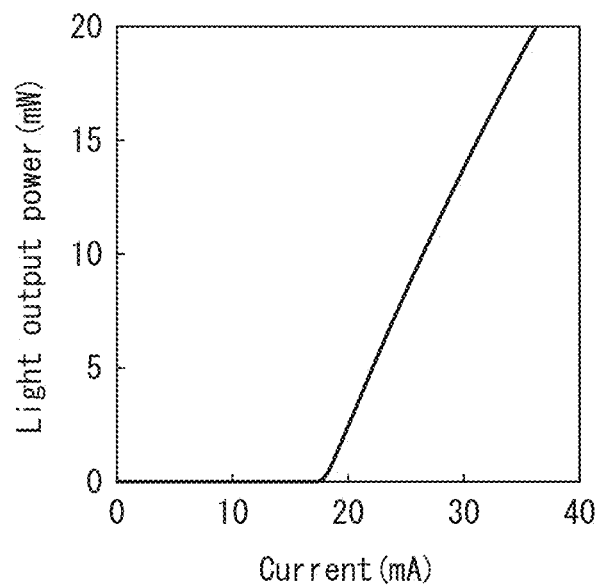
[FIG. 9]
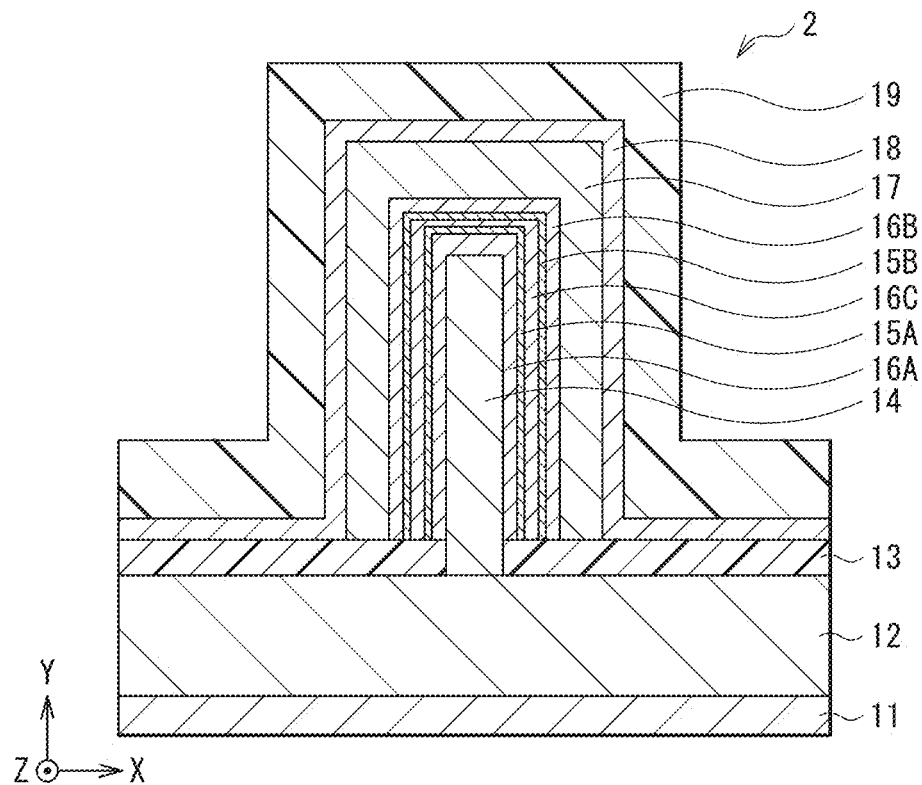

[FIG. 10]
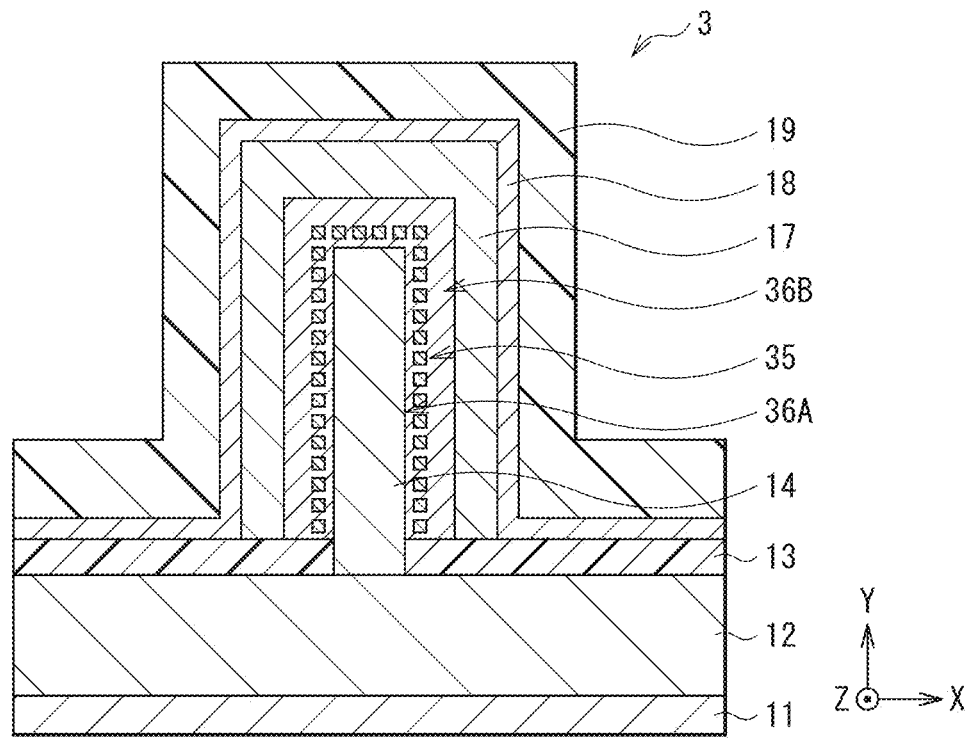
[FIG. 11]
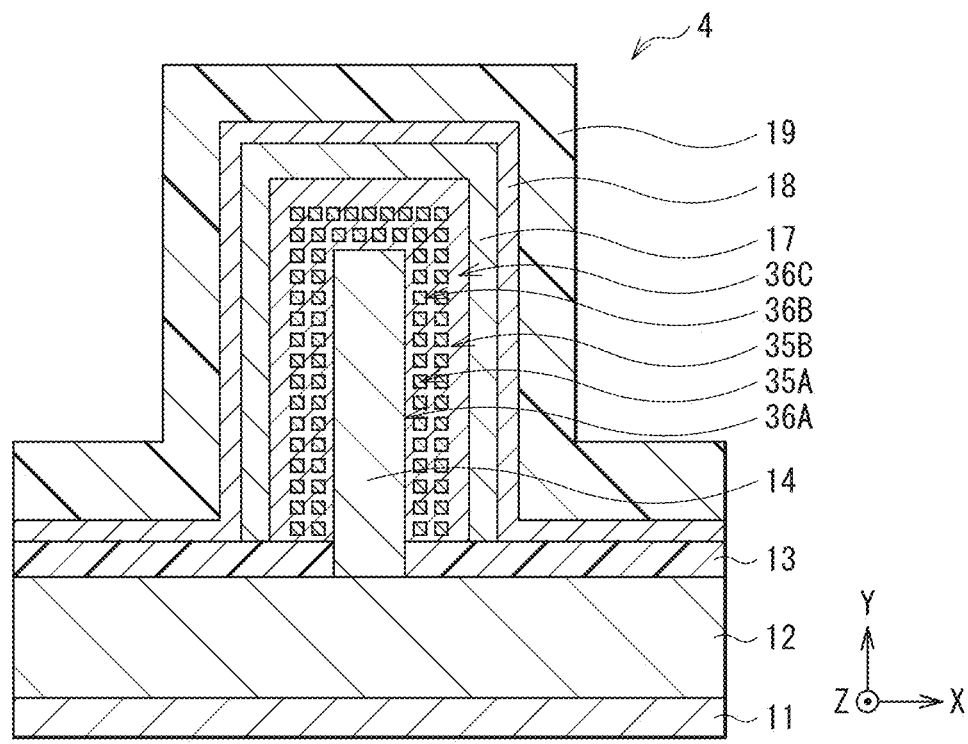

[FIG. 12]
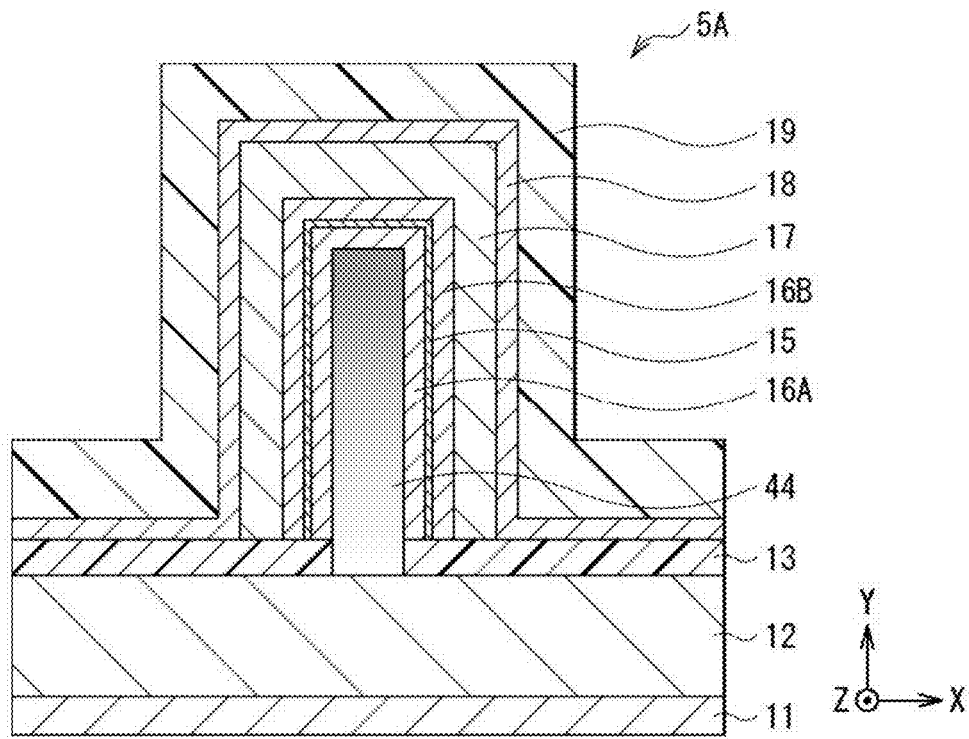
[FIG. 13]
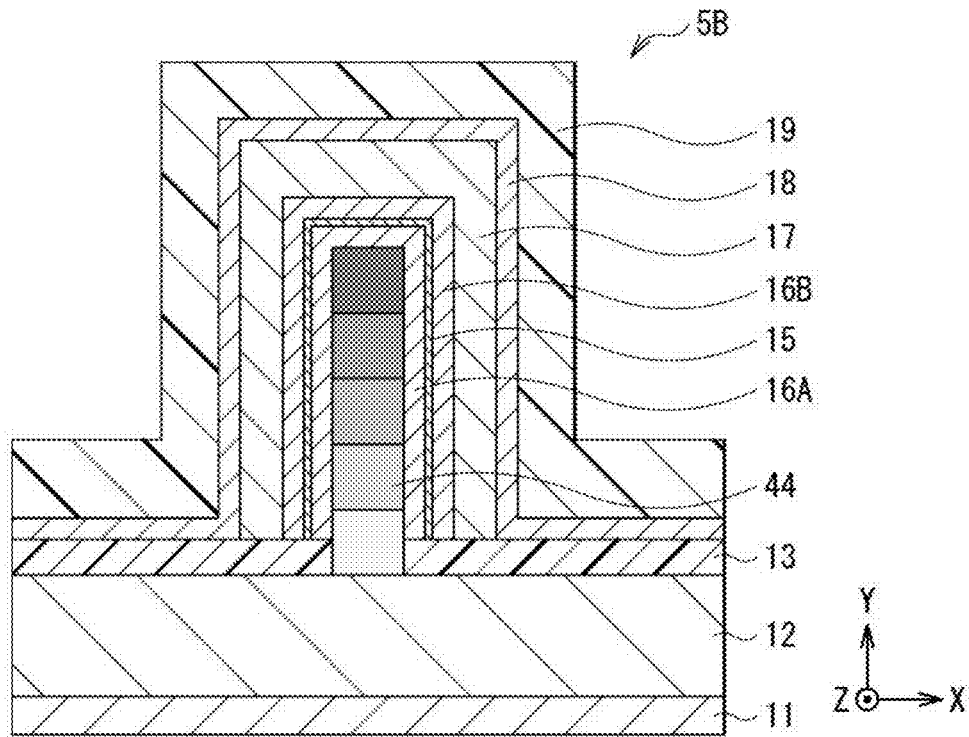

[FIG. 14]
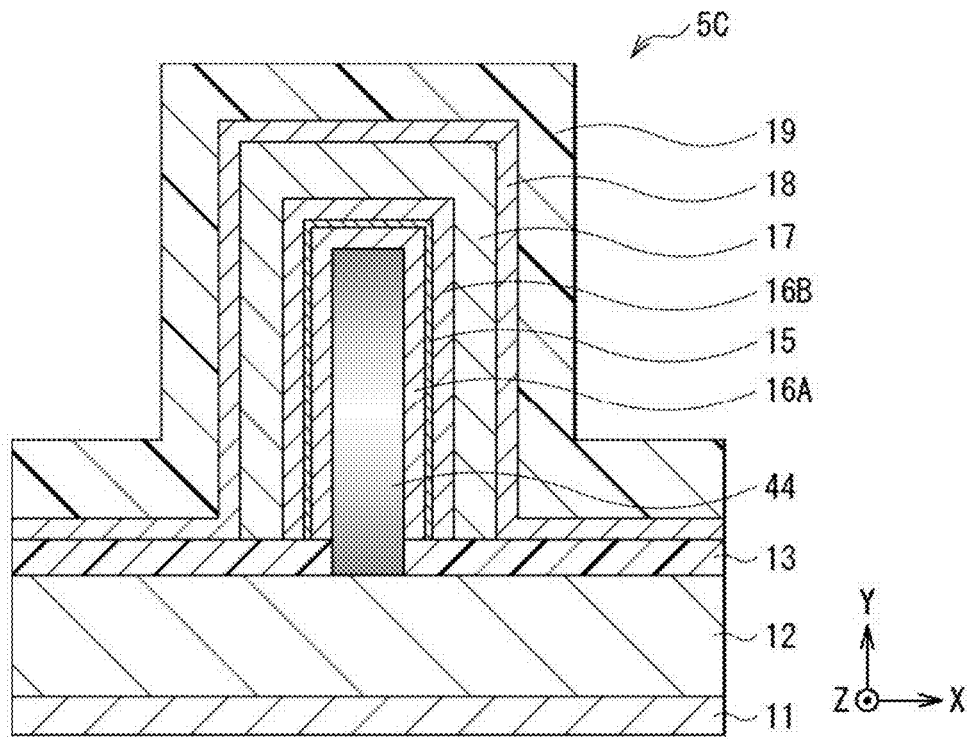
[FIG. 15]
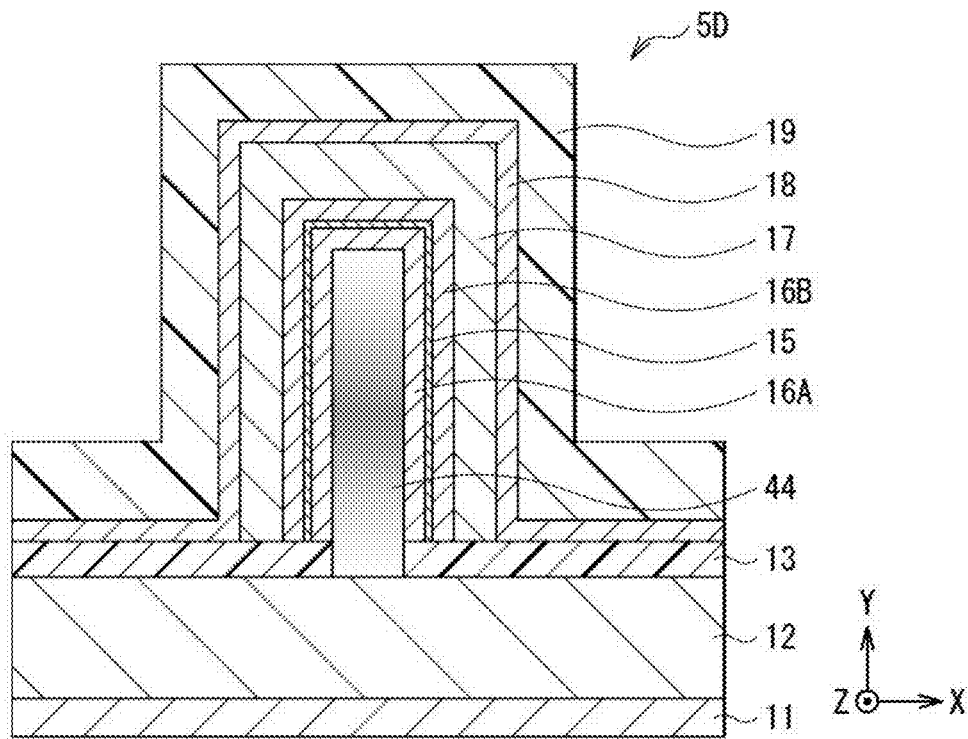

[FIG. 16]
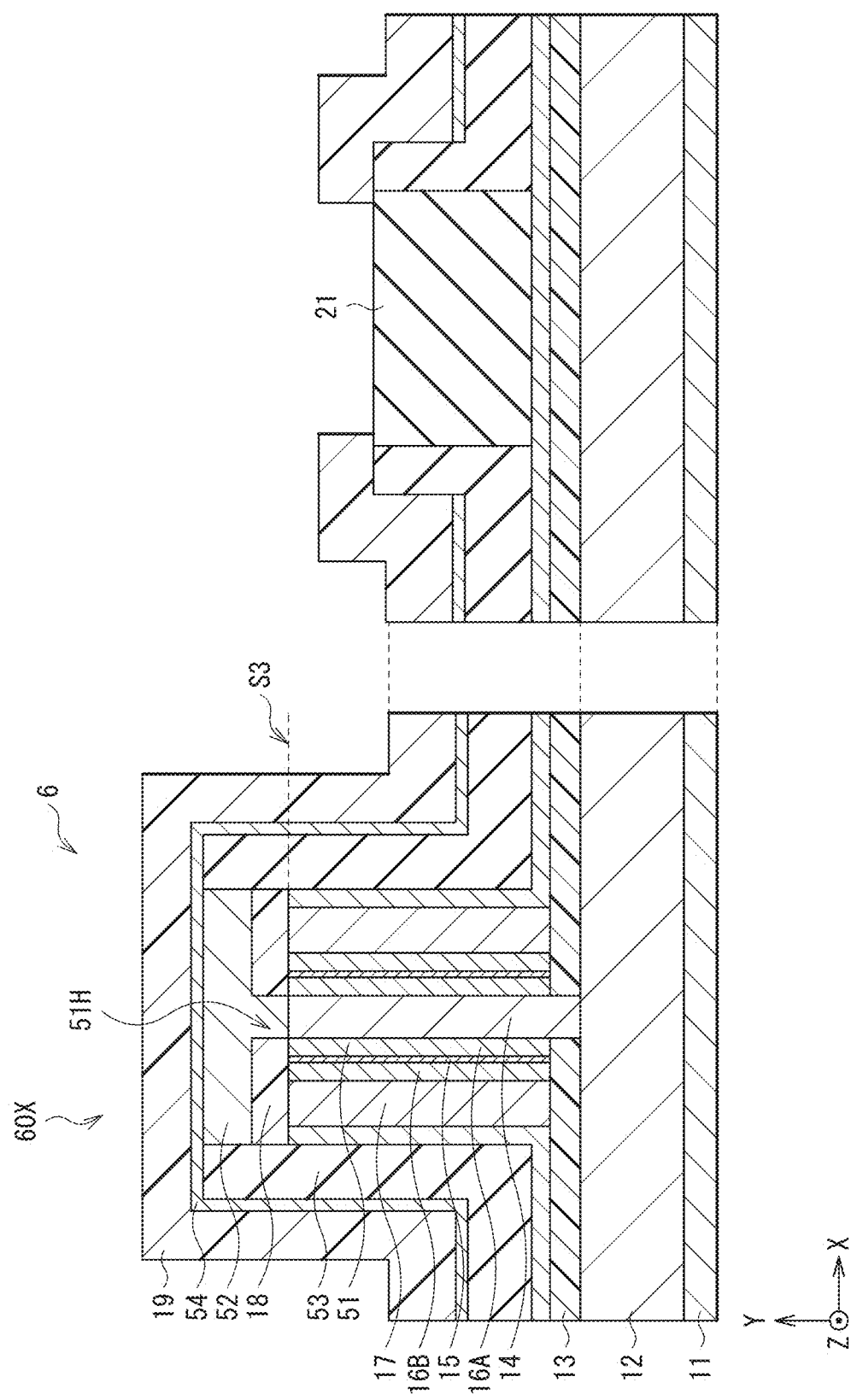

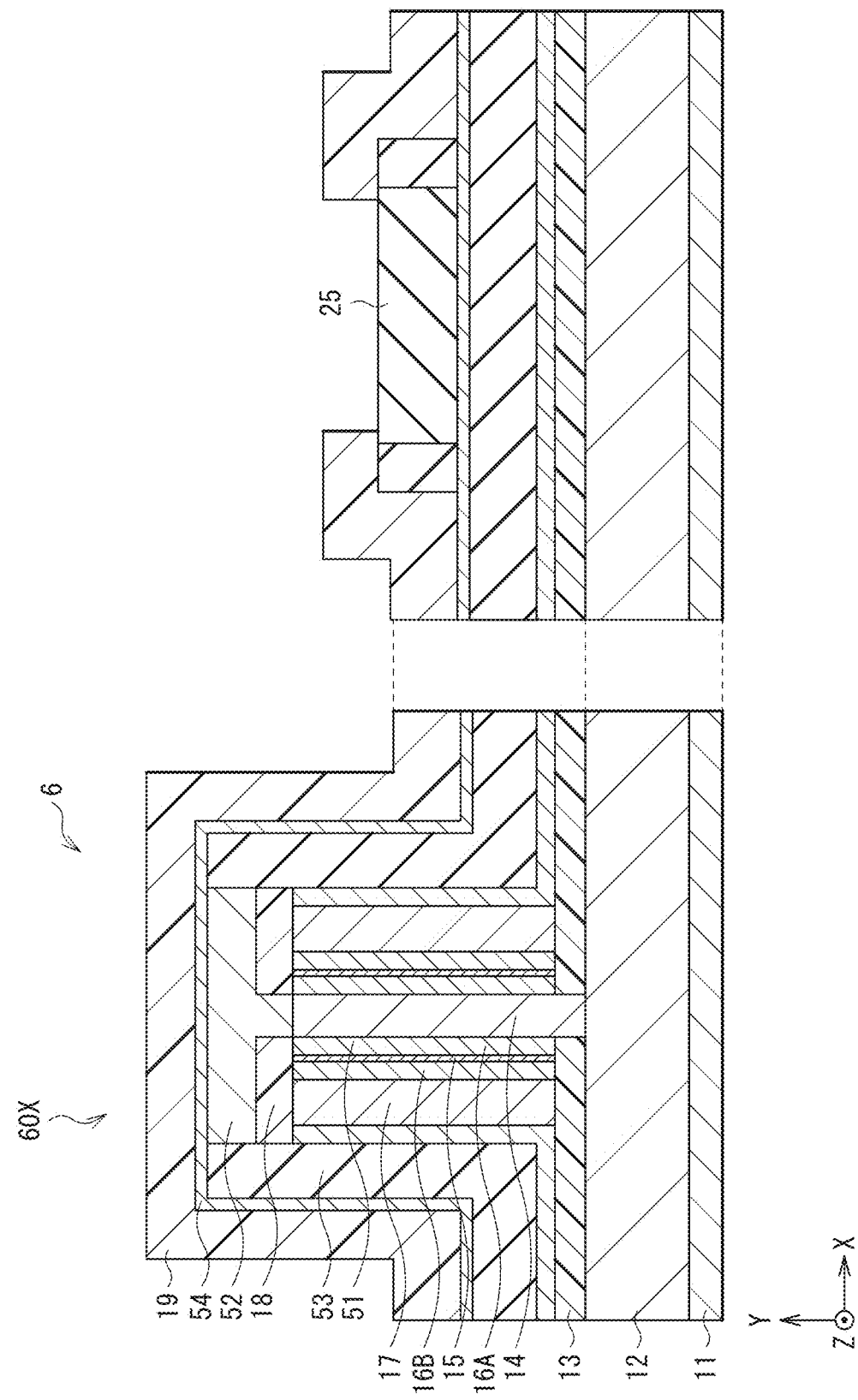
[FIG. 17]

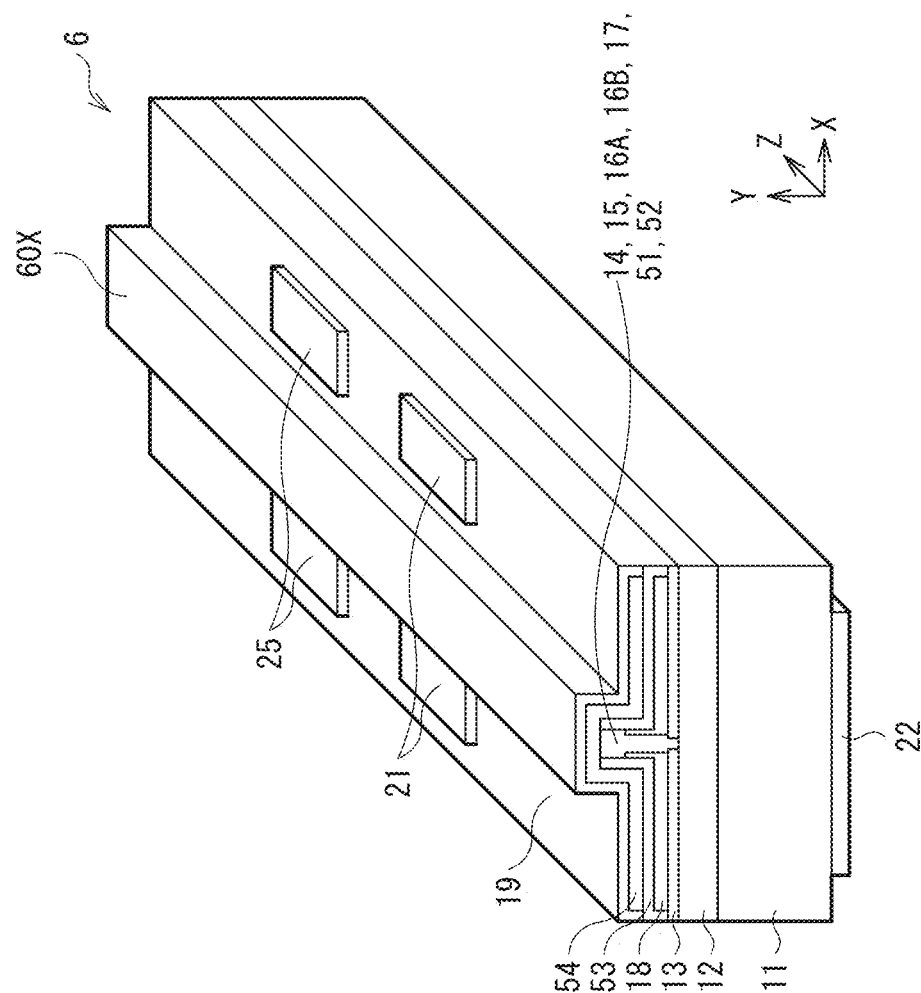
[FIG. 18]

[FIG. 19A]
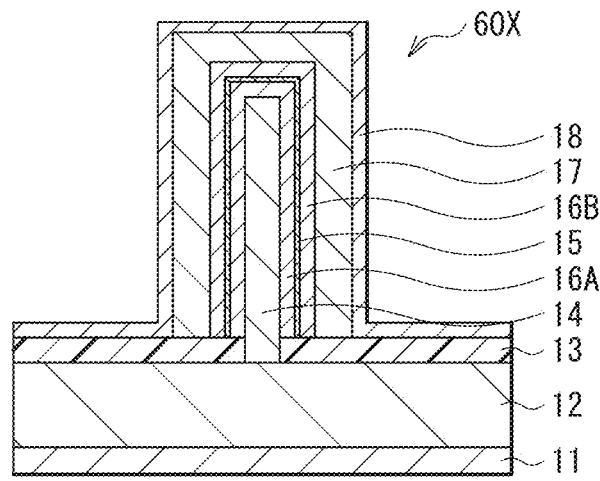
[FIG. 19B]
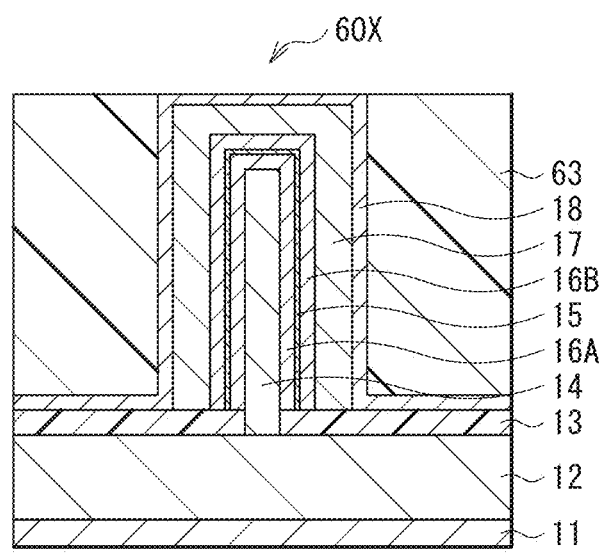
[FIG. 19C]
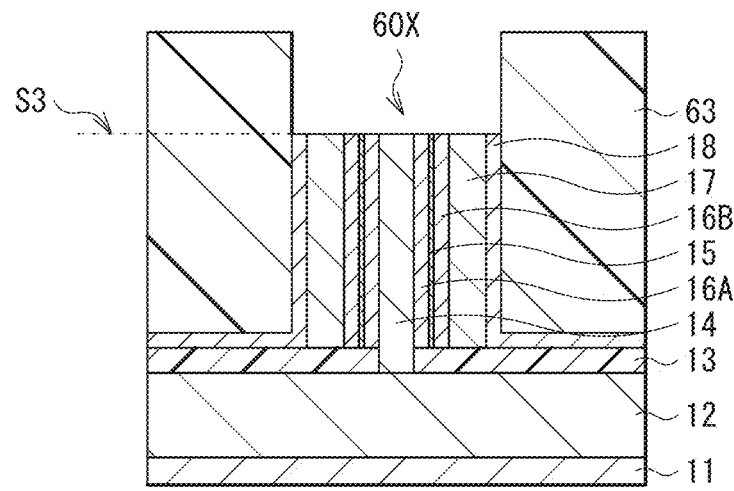

[FIG. 19D]
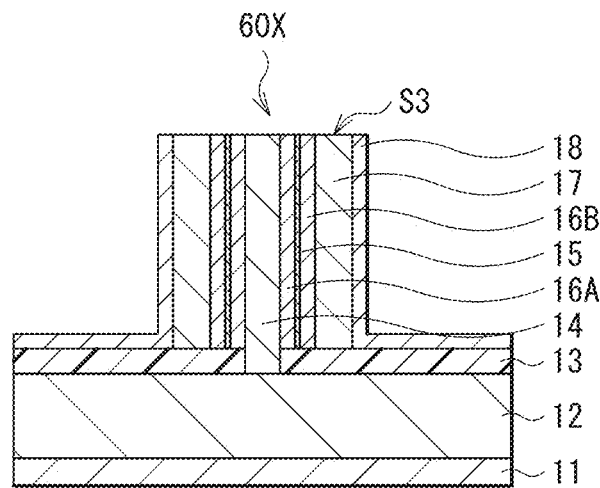
[FIG. 19E]
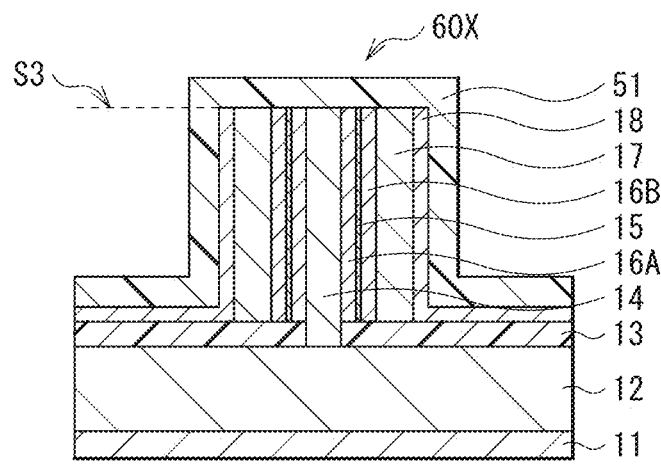
[FIG. 19F]
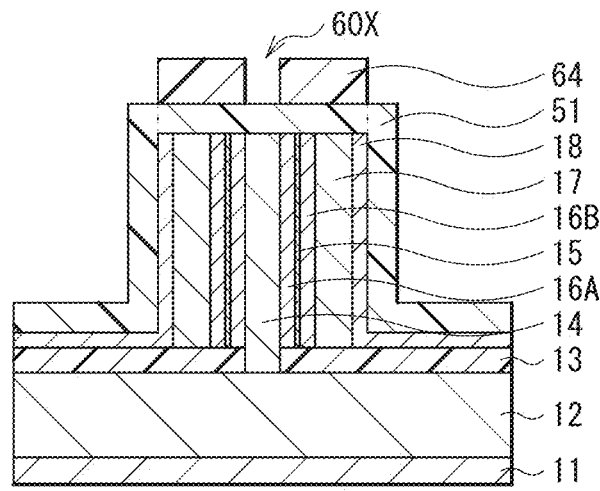

[FIG. 19G]
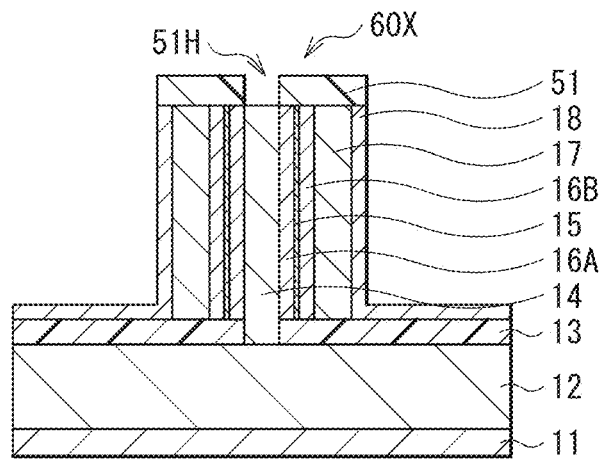
[FIG. 19H]
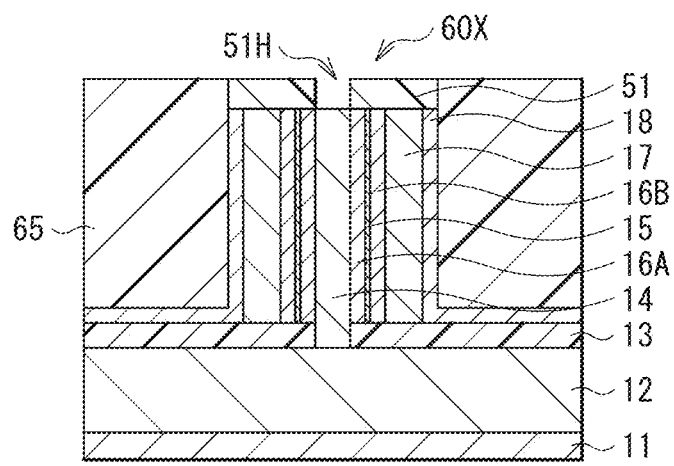
[FIG. 19I]
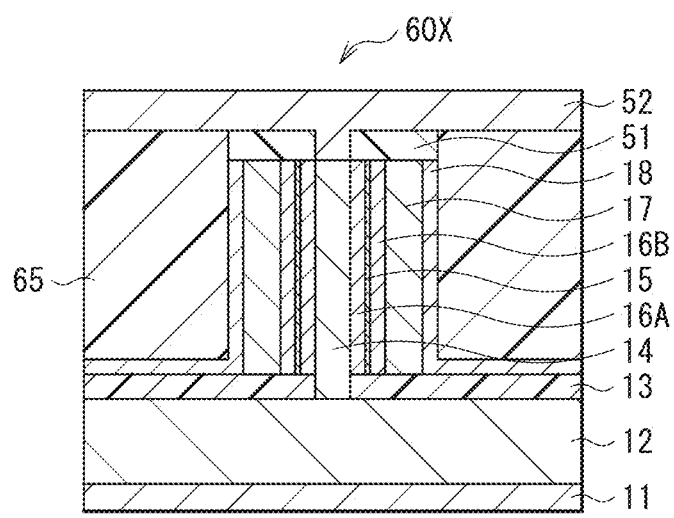

[FIG. 19J]
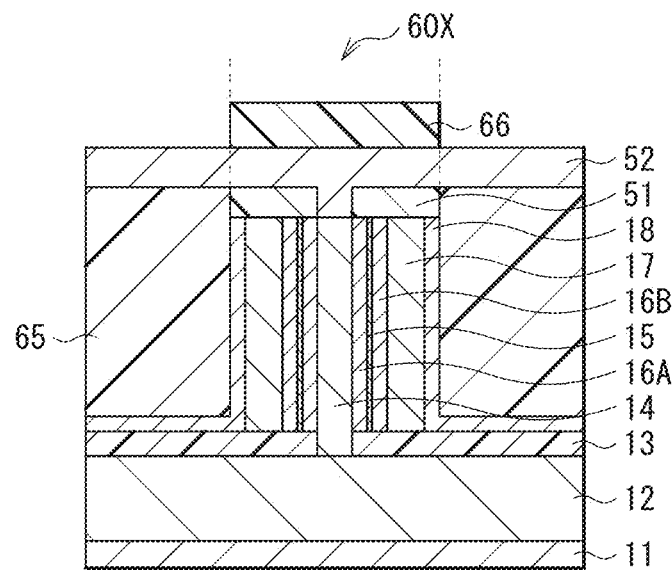
[FIG. 19K]
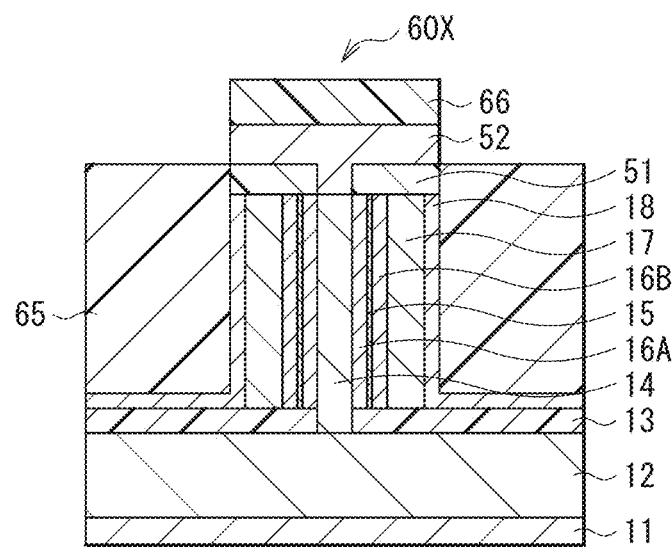

[FIG. 19L]
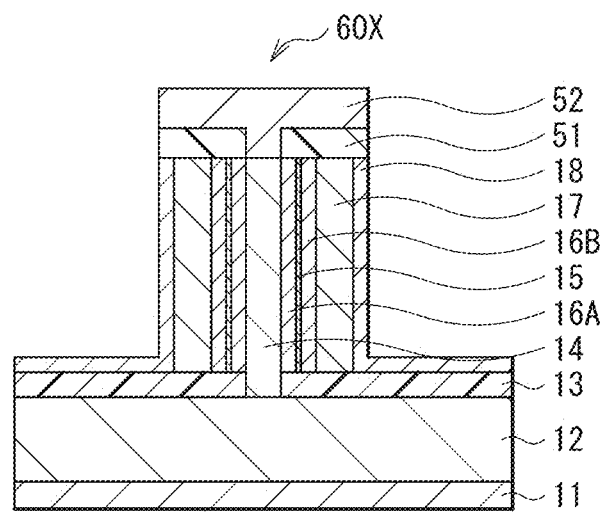
[FIG. 19M]
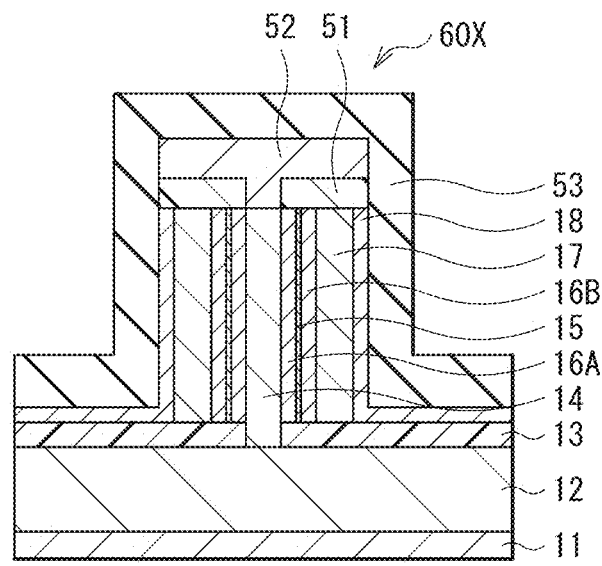

[FIG. 19N]
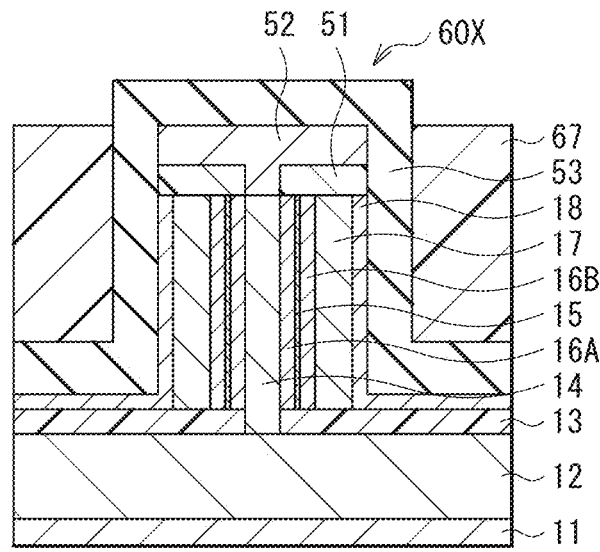
[FIG. 19O]
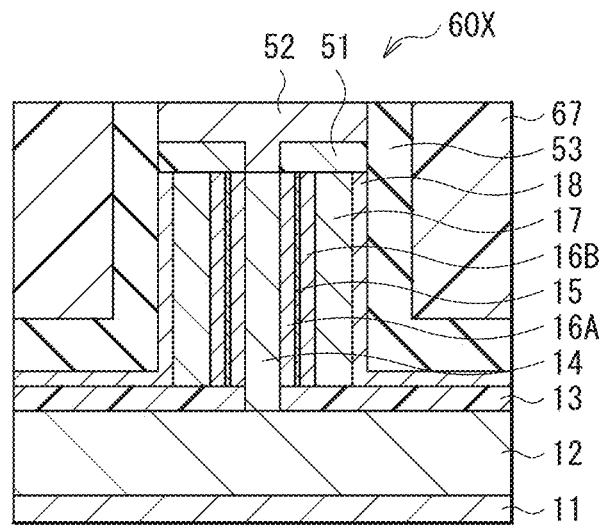

[FIG. 19P]
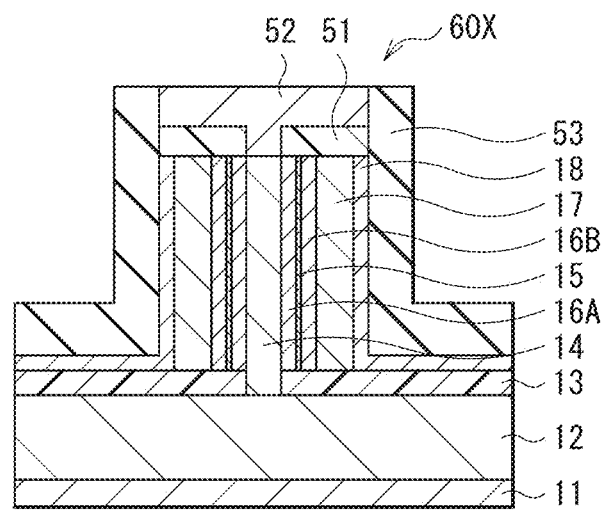
[FIG. 19Q]
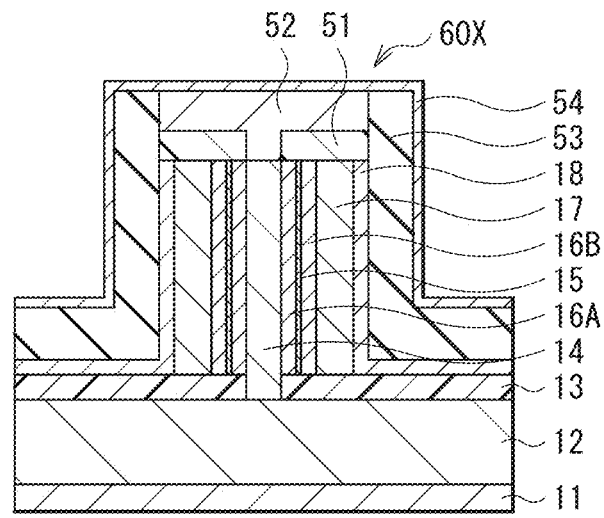

[FIG. 19R]
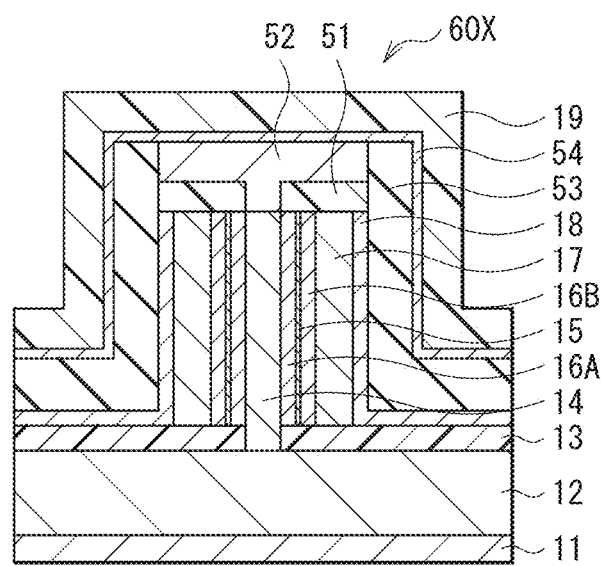

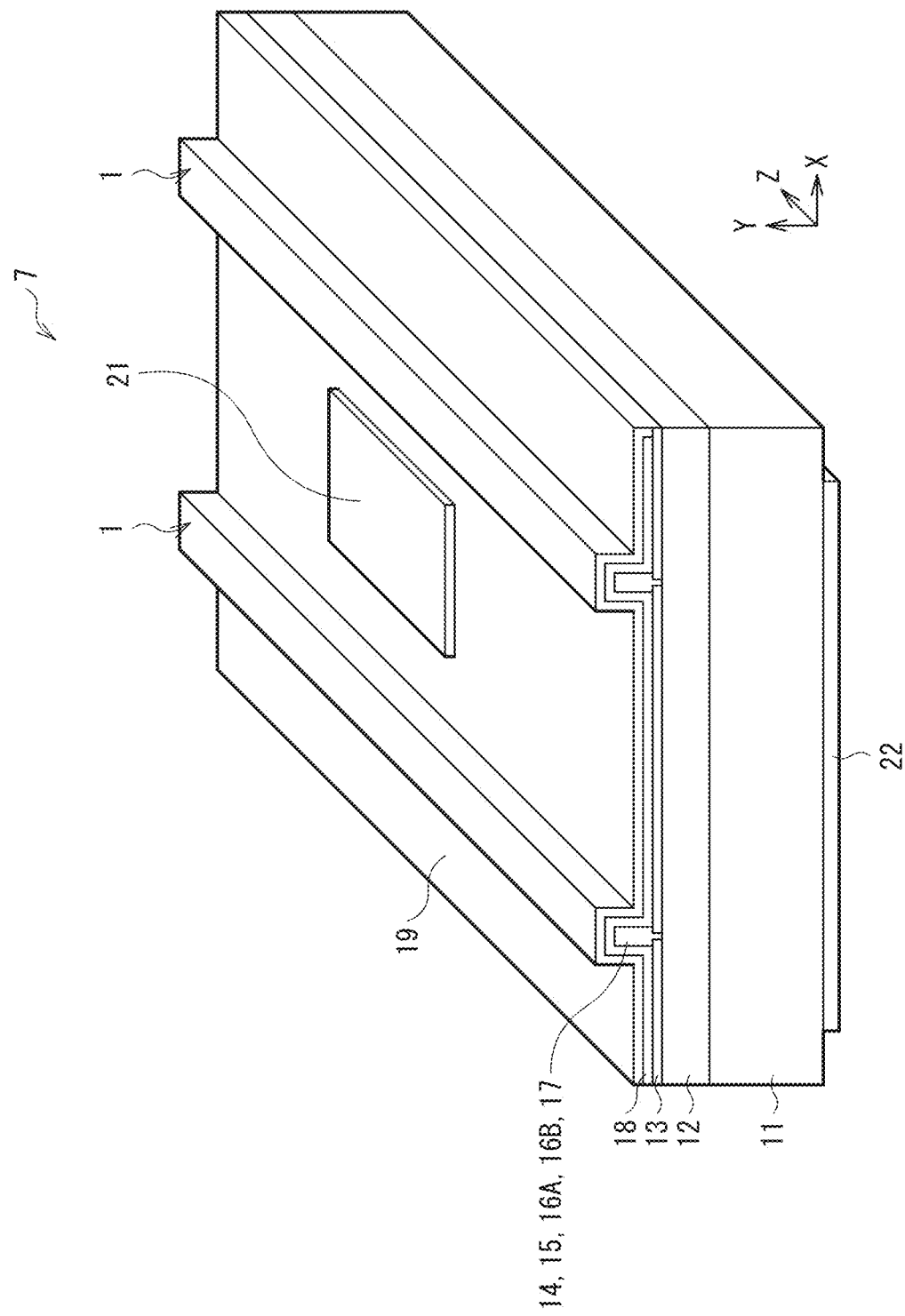
[FIG. 20]

NITRIDE SEMICONDUCTOR LASER DEVICE AND METHOD OF MANUFACTURING NITRIDE SEMICONDUCTOR LASER DEVICE

CROSS REFERENCE TO RELATED APPLICATIONS

This application is a U.S. National Phase of International Patent Application No. PCT/JP2019/041860 filed on Oct. 25, 2019, which claims priority benefit of Japanese Patent Application No. JP 2018-216957 filed in the Japan Patent Office on Nov. 20, 2018. Each of the above-referenced applications is hereby incorporated herein by reference in its entirety.

TECHNICAL FIELD

The present disclosure relates to a nitride semiconductor laser device using a gallium nitride (GaN) based material and to a method of manufacturing the same.

BACKGROUND ART

Recently, a light emitting device using a gallium nitride (GaN) based material has been actively developed. For example, in a light emitting device that emits light having a wavelength in a visible range, such as a semiconductor laser (LD: Laser Diode) or a light emitting diode (LED: Light Emitting Diode), GaInN is used as the GaN based material to form a light emitting layer. Regarding GaInN, the higher the composition of In is, the longer the light emission wavelength becomes. Currently, light emitting devices of blue-violet, blue, and green bands having a relatively low indium (In) composition have been put into practical use. In contrast, in a wavelength band that is longer than the green band and has a relatively high In composition, light emission efficiency decreases as the In composition increases.

To address this, for example, PTL 1 discloses a III-nitride structure in which a nanometer-order fine wall-shaped structure (nanowall) is provided on a substrate to thereby suppress generation of threading dislocation and improve light emission efficiency. In this III-nitride structure, the fine wall-shaped structure includes, for example, a plurality of layers, and an active layer is provided as one of them.

CITATION LIST

Patent Literature

PTL 1: International Publication No. 2009/069286

SUMMARY OF THE INVENTION

As described above, a method of improving light emission efficiency has been reported, but it is assumed to use an LED. Therefore, it is difficult to apply the above-described method to an LD, and it is desired to develop a method of improving light emission efficiency of the LD.

It is desirable to provide a nitride semiconductor laser device and a method of manufacturing the same that each make it possible to improve light emission efficiency.

A nitride semiconductor laser device of one embodiment of the present disclosure includes a single-crystal substrate, a base layer, a sheet-shaped structure, a light emitting layer, and a resonator mirror. The single-crystal substrate extends in one direction. The base layer is provided on the single-crystal substrate and includes a nitride semiconductor. The sheet-shaped structure is provided on the base layer to stand in a direction perpendicular to the base layer. The sheet-shaped structure has an area of a side surface that is greater than an area of an upper surface. The side surface extends in a longitudinal direction of the single-crystal substrate. The sheet-shaped structure includes a nitride semiconductor. The light emitting layer is provided at least on the side surface of the sheet-shaped structure. The light emitting layer includes a nitride semiconductor. The resonator mirror is provided by a pair of end surfaces of the sheet-shaped structure that oppose each other in the longitudinal direction.

A method of manufacturing a nitride semiconductor laser device of one embodiment of the present disclosure includes: providing a base layer on a single-crystal substrate that extends in one direction, the base layer including a nitride semiconductor; forming a sheet-shaped structure in a direction perpendicular to the base layer, the sheet-shaped structure having an area of a side surface that is greater than an area of an upper surface, the side surface extending in a longitudinal direction of the single-crystal substrate, the sheet-shaped structure including a nitride semiconductor; forming a light emitting layer at least on the side surface of the sheet-shaped structure, the light emitting layer including a nitride semiconductor; and forming a resonator mirror on a pair of end surfaces of the sheet-shaped structure that oppose each other in the longitudinal direction.

In the nitride semiconductor laser device of the embodiment of the present disclosure and the method of manufacturing a nitride semiconductor laser device of the embodiment of the present disclosure, the base layer including the nitride semiconductor is provided on the single-crystal substrate that extends in one direction. The sheet-shaped structure is provided on the base layer to stand in the direction perpendicular to the base layer. The sheet-shaped structure extends in the longitudinal direction of the single-crystal substrate, has the area of the side surface that is greater than the area of the upper surface, and includes the nitride semiconductor. The light emitting layer is provided at least on the side surface of the sheet-shaped structure, and includes the nitride semiconductor. This reduces an influence of threading dislocation generated from the single-crystal substrate, the base layer, or the like on the light emitting layer.

BRIEF DESCRIPTION OF DRAWINGS

FIG. 1 is a schematic cross-sectional view of a configuration of a semiconductor laser device according to a first embodiment of the present disclosure.

FIG. 2 is a schematic cross-sectional view of the semiconductor laser device illustrated in FIG. 1 which is viewed from another direction.

FIG. 3 is a perspective view of an overall configuration of the semiconductor laser device illustrated in FIG. 1.

FIG. 4A is a diagram illustrating a wurtzite crystal structure.

FIG. 4B is a diagram for defining a notation of lattice constants of each part of the semiconductor laser device illustrated in FIG. 1.

FIG. 5A is a schematic cross-sectional view for describing a manufacturing process of the semiconductor laser device illustrated in FIG. 1.

FIG. 5B is a schematic cross-sectional view of a process following that in FIG. 5A.

FIG. 5C is a schematic cross-sectional view of a process following that in FIG. 5B.

FIG. 5D is a schematic cross-sectional view of a process following that in FIG. 5C.

FIG. 5E is a schematic cross-sectional view of a process following that in FIG. 5D.

FIG. 5F is a schematic cross-sectional view of a process following that in FIG. 5E.

FIG. 5G is a schematic cross-sectional view of a process following that in FIG. 5F.

FIG. 6 is a schematic cross-sectional view of a simulation model used in a simulation of a light emission characteristic of the semiconductor laser device illustrated in FIG. 1.

FIG. 7 is a light intensity distribution diagram of a transverse waveguide mode of the simulation model illustrated in FIG. 6.

FIG. 8 is a characteristic diagram illustrating a relationship between a current and a light output using the simulation model illustrated in FIG. 6.

FIG. 9 is a schematic cross-sectional view of a configuration of a semiconductor laser device of a second embodiment of the present disclosure.

FIG. 10 is a schematic cross-sectional view of a configuration of a semiconductor laser device according to a third embodiment of the present disclosure.

FIG. 11 is a schematic cross-sectional view of a configuration of a semiconductor laser device according to a fourth embodiment of the present disclosure.

FIG. 12 is a schematic cross-sectional view of an example of a configuration of a semiconductor laser device according to Modification 1 of the present disclosure.

FIG. 13 is a schematic cross-sectional view of another example of the configuration of the semiconductor laser device according to Modification 1 of the present disclosure.

FIG. 14 is a schematic cross-sectional view of another example of the configuration of the semiconductor laser device according to Modification 1 of the present disclosure.

FIG. 15 is a schematic cross-sectional view of another example of the configuration of the semiconductor laser device according to Modification 1 of the present disclosure.

FIG. 16 is a schematic cross-sectional view of a configuration of a semiconductor laser device according to Modification 2 of the present disclosure.

FIG. 17 is a schematic cross-sectional view of a configuration of the semiconductor laser device according to Modification 2 of the present disclosure.

FIG. 18 is a perspective view of an overall configuration of the semiconductor laser device illustrated in FIG. 13.

FIG. 19A is a schematic cross-sectional view for describing a manufacturing process of the semiconductor laser device illustrated in FIG. 17.

FIG. 19B is a schematic cross-sectional view of a process following that in FIG. 19A.

FIG. 19C is a schematic cross-sectional view of a process following that in FIG. 19B.

FIG. 19D is a schematic cross-sectional view of a process following that in FIG. 19C.

FIG. 19E is a schematic cross-sectional view of a process following that in FIG. 19D.

FIG. 19F is a schematic cross-sectional view of a process following that in FIG. 19E.

FIG. 19G is a schematic cross-sectional view of a process following that in FIG. 19F.

FIG. 19H is a schematic cross-sectional view of a process following that in FIG. 19G.

FIG. 19I is a schematic cross-sectional view of a process following that in FIG. 19H.

FIG. 19J is a schematic cross-sectional view of a process following that in FIG. 19I.

FIG. 19K is a schematic cross-sectional view of a process following that in FIG. 19J.

FIG. 19L is a schematic cross-sectional view of a process following that in FIG. 19K.

FIG. 19M is a schematic cross-sectional view of a process following that in FIG. 19L.

FIG. 19N is a schematic cross-sectional view of a process following that in FIG. 19M.

FIG. 19O is a schematic cross-sectional view of a process following that in FIG. 19N.

FIG. 19P is a schematic cross-sectional view of a process following that in FIG. 19O.

FIG. 19Q is a schematic cross-sectional view of a process following that in FIG. 19P.

FIG. 19R is a schematic cross-sectional view of a process following that in FIG. 19Q.

FIG. 20 is a perspective view of an overall configuration of a semiconductor laser stripe array according to Modification 3 of the present disclosure.

MODES FOR CARRYING OUT THE INVENTION

The following describes some embodiments of the present disclosure in detail with reference to the drawings. The following description is a specific example of the present disclosure, and the present disclosure is not limited to the following embodiments. Moreover, the present disclosure is not limited to the arrangement, dimensions, dimension ratios, and the like of the respective components illustrated in the drawings. It is to be noted that the description is given in the following order.

1. First Embodiment (An example where a semiconductor nanosheet is provided to stand on a base layer and a light emitting layer is provided around it)
   1-1. Configuration of Semiconductor Laser Device
   1-2. Method of Manufacturing Semiconductor Laser Device
   1-3. Working and Effects
2. Second Embodiment (An example where a semiconductor nanosheet is provided to stand on a base layer and a light emitting layer including a multilayer structure is provided around it)
3. Third Embodiment (An example where a semiconductor nanosheet is provided to stand on a base layer and a quantum-dot light emitting layer is provided around it)
4. Fourth Embodiment (An example where a semiconductor nano sheet is provided to stand on a base layer and a multi-quantum-dot light emitting layer is provided around it)
5. Modification 1 (An example where a gradient is provided in a dopant concentration of a semiconductor nanosheet)
6. Modification 2 (An example where both ends of a semiconductor nanosheet is sandwiched by n-type semiconductor layers)
7. Modification 3 (An example of an array structure)

1. First Embodiment

FIG. 1 schematically illustrates a cross-sectional configuration of a nitride semiconductor laser device (a semiconductor laser device 1) according to a first embodiment of the present disclosure. FIG. 2 schematically illustrates a cross-sectional configuration of the semiconductor laser device 1 taken along a line I-I' illustrated in FIG. 1. FIG. 3 is a schematic perspective view of an overall configuration of the semiconductor laser device illustrated in FIG. 1, etc. A diagram on the left of FIG. 1 illustrates a cross-sectional configuration in the vicinity of a ridge section 10X. A diagram on the right of FIG. 1 illustrates a cross-sectional configuration of a p-electrode pad 21 portion illustrated in FIG. 3. This semiconductor laser device 1 is, for example, a semiconductor laser (LD) that emits light having a wavelength that is longer than or equal to 200 nm and shorter than or equal to 1800 nm, in particular, in a visible range. In the semiconductor laser device 1 of the present embodiment, a substrate 11 extending in one direction (e.g., a Z-axis direction), a base layer 12, and a mask layer 13 are stacked in this order. An n-type semiconductor nanosheet 14 is provided on the base layer 12 to stand in a direction (a Y-axis direction) perpendicular to the base layer 12 through an opening 13H provided in the mask layer 13. In addition, the area of a side surface, of the n-type semiconductor nano sheet 14, extending in a longitudinal direction (the Z-axis direction) of the substrate 11 is greater than the area of an upper surface thereof. A light emitting layer 15 is provided around the n-type semiconductor nanosheet 14. Furthermore, the semiconductor laser device 1 has a resonator mirror R on a pair of end surfaces (a front surface (a surface S1) and a rear surface (a surface S2)) opposing each other in the Z-axis direction.

(1-1. Configuration of Semiconductor Laser Device)

The semiconductor laser device 1 includes a gallium nitride (GaN) based material. As described above, in the semiconductor laser device 1, the substrate 11, the base layer 12, and the mask layer 13 are stacked in this order. The n-type semiconductor nanosheet 14 is provided to stand on the base layer 12, and the light emitting layer 15 is provided around it. The light emitting layer 15 is provided between a barrier layer 16A and a barrier layer 16B. The barrier layer 16A is provided on the n-type semiconductor nanosheet 14 side, for example. Further, a p-type semiconductor layer 17, a p-electrode 18, and a passivation film 19 are provided in this order around the barrier layer 16B covering the light emitting layer 15.

The substrate 11 is, for example, an n-type single-crystal substrate that includes gallium nitride (GaN), and extends, for example, in one direction (the Z-axis direction in FIG. 3). The length (l) of the substrate 11 in the extending direction (the Z-axis direction) is preferably greater than or equal to 100 nm and less than or equal to 5 cm, for example. The film thickness in the Y-axis direction (hereinafter, simply referred to as a thickness) is preferably greater than or equal to 1 μm and less than or equal to 1000 μm, for example. This substrate 11 corresponds to one specific example of a "single-crystal substrate" of the present disclosure.

The base layer 12 is provided on a surface (a surface 11S1) of the substrate 11. The base layer 12 includes, for example, n-type $Al_{x1}Ga_{x2}In_{x3}N$ (0≤x1≤1, 0≤x2≤1, 0≤x3≤1, x1+x2+x3=1). The thickness of the base layer 12 is preferably greater than or equal to 10 nm and less than or equal to 1000 nm, for example.

The mask layer 13 is provided on the base layer 12. The mask layer 13 includes, for example, an inorganic oxide such as silicon oxide ($SiO_2$) or a metal oxide such as aluminum oxide ($Al_2O_3$). The thickness of the mask layer 13 is preferably from 1 nm to 10000 nm both inclusive, for example. Furthermore, the mask layer 13 has the opening 13H at a predetermined position. The width in an X-axis direction (hereinafter, simply referred to as a width) of the opening 13H is greater than or equal to 1 nm and less than or equal to 10000 nm. Note that the width of the opening 13H corresponds to the width (w) of the n-type semiconductor nanosheet 14 which will be described later.

The n-type semiconductor nanosheet 14 is provided on the base layer 12 inside the opening 13H provided in the mask layer 13. The n-type semiconductor nanosheet 14 includes, for example, n-type $Al_{y1}Ga_{y2}In_{y3}N$ (0≤y1≤1, 0≤y2≤1, 0≤y3≤1, y1+y2+y3=1). As described above, the n-type semiconductor nanosheet 14 is provided to stand in the perpendicular direction (the Y-axis direction) on the base layer 12. The n-type semiconductor nanosheet 14 extends in the longitudinal direction (the Z-axis direction) of the substrate 11, and has a shape in which the area of the side surface is greater than the area of the upper surface. This n-type semiconductor nanosheet 14 corresponds to one specific example of a "sheet-shaped structure" of the present disclosure.

Here, the sheet-shaped structure has the shape described above. Specifically, for example, as illustrated in FIG. 1, a ratio (h/w) between h and w is greater than 1 and less than or equal to 1000 where h is the height of the sheet-shaped structure (the n-type semiconductor nanosheet) and w is the width thereof.

In the present embodiment, the n-type semiconductor nanosheet 14 preferably has a width (w) of, for example, greater than or equal to 1 nm and less than or equal to 10000 nm, and preferably has a height (h, a thickness in the Y-axis direction) of, for example, greater than or equal to 1 nm and less than or equal to 10000 nm. Furthermore, the n-type semiconductor nanosheet 14 desirably has a wurtzite crystal structure. That is, the n-type semiconductor nanosheet 14 is formed by crystal growth in the direction (the Y-axis direction) perpendicular to a surface of the base layer, starting from the opening 13H provided in the mask layer 13. The n-type semiconductor nanosheet 14 extends in a <1-100> direction of the crystal structure, and its side surface is a non-polar {11-20} plane or a semipolar plane in a range of greater than or equal to −32° and less than or equal to +32° with respect to the non-polar {11-20} plane. Alternatively, it may extend in a <11-20> direction of the crystal structure, and its side surface may be a non-polar {1-100} plane, or a semi-polar plane in a range of greater than or equal to −28° and less than or equal to +28° with respect to the non-polar {1-100} plane. This reduces an influence of a piezoelectric field on the light emitting layer 15, which will be described later. Note that the above-described ranges are each calculated assuming, as the maximum, a case where unit cells included in the crystal structure have a stair shape.

The light emitting layer 15 is provided along at least the side surface of the n-type semiconductor nanosheet 14. In the present embodiment, the light emitting layer 15 is provided continuously on the side surfaces and the upper surface of the n-type semiconductor nanosheet 14 in such a manner as to cover the periphery of the n-type semiconductor nanosheet 14 standing in the Y-axis direction. The light emitting layer 15 has, for example, a quantum-well structure including $Al_{z1}Ga_{z2}In_{z3}N$ (0≤z1≤1, 0≤z2≤1, 0≤z3≤1, z1+z2+z3=1), and has a light emitting region in the layer. The light emitting layer 15 is preferably provided on the non-polar {11-20} plane or {1-100} of the side surface of the n-type semiconductor nanosheet 14. The thickness of the light emitting layer 15 is preferably greater than or equal to 0.2 nm and less than or equal to 10 nm, for example.

FIG. 4A illustrates a wurtzite crystal structure used in the n-type semiconductor nanosheet 14 of the present embodiment. FIG. 4B defines the notation of lattice constants of each part of the semiconductor laser device 1 illustrated in FIG. 1. It is preferable that a magnitude relationship between the lattice constants of the base layer 12, the n-type semiconductor nanosheet 14, and the light emitting layer 15 satisfy expressions (1) and (2) below where $(a_x, c_x)$ are the lattice constants of the crystal structure in n-type AlGaInN included in the base layer 12, $(a_y, c_y)$ are the lattice constants of the crystal structure in n-type AlGaInN included in the n-type semiconductor nanosheet 14, and $(a_z, c_z)$ are the lattice constants of the crystal structure in n-type AlGaInN included in the light emitting layer 15. Thus, the degree of lattice mismatch between the base layer 12 and the light emitting layer 15 is alleviated by the n-type semiconductor nanosheet 14, thereby reducing formation of crystal defects in the light emitting layer 15.

(math. 1) $a_x \leq a_y$ (1)

(math. 2) $c_y \leq c_z$ (2)

Further, in a case where the base layer 12, the n-type semiconductor nanosheet 14, and the light emitting layer 15 include n-type AlGaInN, the composition of indium (In) in the n-type AlGaInN preferably satisfies an expression (3) below. Thus, the degree of the lattice mismatch between the base layer 12 and the light emitting layer 15 is alleviated by the n-type semiconductor nanosheet 14, thereby reducing formation of crystal defects in the light emitting layer 15.

(math. 3) $Z3 > Y3 > X3 > 0$ (3)

(X1+X2+X3=1, Y1+Y2+Y3=1, Z1+Z2+Z3=1, 0≤{X1, X2, X3, Y1, Y2, Y3, Z1, Z2, Z3}≤1)

The light emitting layer 15 is sandwiched by the barrier layer 16A and the barrier layer 16B. The barrier layer 16A is provided between the n-type semiconductor nanosheet 14 and the light emitting layer 15. The barrier layer 16A is provided in such a manner as to cover the side surfaces and the upper surface of the n-type semiconductor nanosheet 14. The barrier layer 16A includes, for example, undoped or n-type AlGaInN. The thickness of the barrier layer 16A is preferably from 1 nm to 100 nm both inclusive, for example. The barrier layer 16B is provided on the light emitting layer 15 in such a manner as to cover the light emitting layer 15. The light emitting layer 15 is provided in such a manner as to continuously cover the side surfaces and the upper surface of the n-type semiconductor nanosheet 14. The barrier layer 16B includes, for example, undoped or p-type AlGaInN. The thickness of the barrier layer 16B is preferably from 1 nm to 100 nm both inclusive, for example.

The p-type semiconductor layer 17 is provided on the barrier layer 16B in such a manner as to cover the barrier layer 16B. The p-type semiconductor layer 17 includes, for example, p-type AlGaInN. The thickness of the p-type semiconductor layer 17 is preferably greater than or equal to 1 nm and less than or equal to 10000 nm, for example.

The p-electrode 18 covers around the p-type semiconductor layer 17, and is continuously provided on the mask layer 13 that extends on both sides of the ridge section 10X. The ridge section 10X includes: the n-type semiconductor nanosheet 14 provided to stand on the base layer 12; and the light emitting layer 15, the barrier layers 16A and 16B, and the p-type semiconductor layer 17 covering around it. The p-electrode 18 includes, for example, a transparent electrode material such as ITO (Indium Tin Oxide). The thickness of the p-electrode 18 is preferably greater than or equal to 1 nm and less than or equal to 1000 nm, for example.

The passivation film 19 is for protecting the surface of the semiconductor laser device 1. The passivation film 19 is provided in such a manner as to cover an upper surface and side surfaces of the p-electrode 18, for example. The passivation film 19 includes, for example, silicon nitride. The thickness of the passivation film 19 is preferably greater than or equal to 1 nm and less than or equal to 10000 nm, for example.

The p-electrode pad 21 is an electrode for drawing out the p-electrode 18. The p-electrode pad 21 is electrically coupled to the p-electrode 18. As illustrated in FIG. 3, the p-electrode pad 21 is provided, for example, on the side of the ridge section 10X. The p-electrode pad 21 is provided, for example, on the p-electrode 18. As illustrated in FIG. 1, the p-electrode pad 21 is partially exposed by providing an opening in the passivation film 19 provided thereon. The p-electrode pad 21 includes gold (Au), for example.

An n-electrode 22 including titanium (Ti) is provided on a rear surface (a surface 11S2) of the substrate 11, for example. A pair of end surfaces (the front surface (the surface S1) and the rear surface (the surface S2)), of the semiconductor laser device 1, opposing each other in the Z-axis direction serves as resonator end surfaces. One of the resonator end surfaces is provided with a front-end-surface coating film 23 and the other is provided with a rear-end-surface coating film 24. The front-end-surface coating film 23 and the rear-end-surface coating film 24 include, for example, silicon oxide ($SiO_2$). Note that it is preferable to form the resonator end surfaces by performing a physical processing such as cleaving or dry etching on the {11-20} plane or the {1-100} plane. Thus, the resonator mirror R that is able to perform laser oscillation is provided on the pair of end surfaces (the surface S1 and the surface S2), of the semiconductor laser device 1, opposing each other in the Z-axis direction.

(1-2. Manufacturing Method of Semiconductor Laser Device)

The semiconductor laser device 1 of the present embodiment can be manufactured, for example, as follows. FIGS. 5A, 5B, 5C, 5D, 5E, 5F, and 5G illustrate a method of manufacturing the semiconductor laser device 1 in the order of processes.

First, as illustrated in FIG. 5A, the substrate 11 is prepared. Thereafter, as illustrated in FIG. 5B, an n-AlGaInN film is grown on the substrate 11 to form the base layer 12. Thereafter, as illustrated in FIG. 5C, the mask layer 13 is formed on the base layer 12, for example, by a chemical vapor deposition method (a CVD method).

Thereafter, the opening 13H is provided at a predetermined position of the mask layer 13, following which, as illustrated in FIG. 5D, the n-type semiconductor nanosheet 14 is formed, for example, by a molecular beam epitaxy method (an MBE method). Thereafter, as illustrated in FIG. 5E, the barrier layer 16A, the light emitting layer 15, and the barrier layer 16B are formed in order around the n-type semiconductor nanosheet 14. Specifically, for example, an undoped AlGaInN film is formed, for example, by an MO-CVD method to form the barrier layer 16A. Thereafter, similarly, the light emitting layer 15 including, for example, AlGaInN is formed by an MO-CVD method, following which, similarly, an undoped AlGaInN film is formed by an MO-CVD method to form the barrier layer 16B.

Thereafter, as illustrated in FIG. 5F, for example, the p-type semiconductor layer 17 covering the barrier layer 16B is formed by an MO-CVD method. Thereafter, as illustrated in FIG. 5G, a metal film for the p-electrode 18 is formed by an atomic layer deposition method (an ALD method), for example, following which the metal film is patterned by reactive ion etching (RIE) to form the p-electrode 18, for example. Thereafter, the p-electrode pad 21 is formed at a predetermined position on the p-electrode 18, following which the passivation film 19 covering the upper surface and the side surfaces of the p-electrode 18 and the p-electrode pad 21 is formed. Thereafter, an opening is provided in the passivation film 19 on the p-electrode pad 21. Lastly, for example, resonator end surfaces are formed on the front surface (the surface S1) and the rear surface (the surface S2) of the semiconductor laser device 1 by cleaving, following which the front-end-surface coating film is formed on the front surface (the surface S1) and the rear-end-surface coating film is formed on the rear surface (the surface S2), for example, by sputtering. Thus, the semiconductor laser device 1 illustrated in FIGS. 1, 2, and 3 is completed.

(1-3. Working and Effects)

As described above, as a gallium nitride (GaN) based light emitting device, a light emitting device using GaInN has been developed. A light emitting layer including GaInN emits light having a wavelength in a visible range, and its light emission wavelength becomes longer as the composition of In becomes higher. Currently, light emitting devices of blue-violet, blue, and green bands having a relatively low indium (In) composition have been put into practical use. In contrast, in a wavelength band that is longer than a green band and has a relatively high In composition, light emission efficiency tends to decrease as the In composition increases. Therefore, for example, a light emitting device of a red band has not reached a practical-use level.

Generally, in a case where a crystal is grown on a c-plane GaN substrate, a piezoelectric field is generated in a c-axis direction. Under the influence of the piezoelectric field, light emission efficiency in the GaInN light emitting layer decreases. Further, regarding the GaInN light emitting layer, the degree of lattice mismatch with the GaN substrate increases as the In composition increases, deteriorating crystal quality. As a result, non-radiative recombination centers are generated, decreasing light emission efficiency.

As a method of solving the above-described issue, for example, there is a method of suppressing generation of threading dislocation by forming a nanometer-order fine wall-shaped structure (nanowall) including the light emitting layer on a substrate, as described above. In addition, there has been reported a method of forming a light emitting layer including GaInN around a nitride nanorod. However, for the above-described method, it is assumed to use a light emitting diode (LED). Therefore, it is difficult to obtain a sufficient effect with a semiconductor laser (LD). Further, there has also been reported a method of reducing the degree of lattice mismatch between the substrate and the light emitting layer by using a GaInN template substrate. However, there is an issue that it is difficult to obtain a crystal having enough quality for mass production on a GaInN template substrate. Therefore, there is a need for a method of improving light emission efficiency of a semiconductor laser.

To address this, in the semiconductor laser device 1 of the present embodiment, for example, the n-type semiconductor nanosheet 14 standing in the Y-axis direction is provided on the base layer 12 provided on the substrate 11 extending in the Z-axis direction, and the light emitting layer 15 is provided on the side surfaces and the upper surface thereof. This prevents threading dislocation that is generated from the base layer 12, the n-type semiconductor nanosheet 14, or the like and extends in a direction perpendicular to the surface of the substrate 11 from running through the light emitting layer 15.

FIG. 6 is a plan view of a simulation model used in a simulation of a light emission characteristic of the semiconductor laser device 1 illustrated in FIG. 1. In the present simulation, it is assumed that the light emitting layer 15 includes GaInN and contains In at a rate of 30%. FIG. 7 illustrates a simulation result of a light intensity distribution in a transverse waveguide mode of the simulation model illustrated in FIG. 6. FIG. 8 illustrates a relationship between a current and a light output where the simulation model illustrated in FIGS. 5A, 5B, 5C, 5D, 5E, 5F, and 5G is used. From the simulation results illustrated in FIGS. 7 and 8, it can be appreciated that the semiconductor laser device 1 of the present embodiment is able to obtain satisfactory laser oscillation at a wavelength of 505 nm.

As described above, in the semiconductor laser device 1 of the present embodiment, for example, the n-type semiconductor nanosheet 14 standing in the perpendicular direction (the Y-axis direction) is provided on the base layer 12 provided on the substrate 11 extending in the Z-axis direction, and the light emitting layer 15 is provided on the side surfaces thereof. This reduces an influence of threading dislocation that is generated from the base layer 12, the n-type semiconductor nanosheet 14, or the like and extends perpendicularly to the surface of the substrate 11, making it possible to suppress a decrease in light emission efficiency due to the threading dislocation.

Moreover, in the present embodiment, the n-type semiconductor nanosheet 14 is formed using a wurtzite crystal structure. Further, the side surface of the n-type semiconductor nanosheet 14 is a non-polar {11-20} plane, a semipolar plane in a range of greater than or equal to −32° and less than or equal to +32° with respect to the non-polar {11-20} plane, a non-polar {1-100} plane, or a semipolar plane in a range of greater than or equal to −28° and less than or equal to +28° with respect to the non-polar {1-100} plane. This reduces an influence of a piezoelectric field on the light emitting layer 15. Accordingly, it is possible to prevent a decrease in light emission efficiency due to a quantum-confined Stark effect.

Moreover, in the present embodiment, the light emitting layer 15 is provided on the side surfaces of the n-type semiconductor nanosheet 14 having lattice constants that are greater than those of the base layer 12 (the above-described expression (1)) and smaller than those of the light emitting layer 15 (the above-described expression (2)). Therefore, the degree of lattice mismatch between the base layer 12 and the light emitting layer 15 is alleviated. Accordingly, it is possible to suppress formation of crystal defects accompanying lattice mismatch occurring in the light emitting layer 15.

As described above, in the present embodiment, it is possible to provide the semiconductor laser device 1 having high light emission efficiency.

Moreover, in the present embodiment, the light emitting layer 15 is provided on the side surfaces of the n-type semiconductor nanosheet 14 having a non-polar plane {11-20} plane. Therefore, it is possible to suppress a shift (blue shift) of a light emission spectrum toward the short wavelength side accompanying an increase in current value.

Moreover, in the present embodiment, in a case where, for example, a sapphire substrate, a silicon (Si) substrate, an aluminum nitride (AlN) substrate, a zinc oxide (ZnO) substrate, or the like is used instead of the GaN substrate as the substrate 11, it is also possible to obtain effects similar to those in the case where the GaN substrate is used. Therefore, it is possible to reduce cost.

Next, second to fourth embodiments and modifications (Modifications 1 to 3) of the present disclosure are described. In the following, components similar to those of the first embodiment described above are denoted by the same reference numerals, and descriptions thereof are omitted where appropriate.

2. Second Embodiment

FIG. 9 schematically illustrates a cross-sectional configuration of a nitride semiconductor laser device (a semiconductor laser device 2) according to a second embodiment of the present disclosure. As with the semiconductor laser device 1 of the first embodiment described above, this semiconductor laser device 2 is, for example, a semiconductor laser (LD) that emits light having a wavelength that is longer than or equal to 200 nm and shorter than or equal to 1800 nm, in particular, in a visible range. The semiconductor laser device 2 of the present embodiment differs from the first embodiment described above in that the light emitting layer 15 provided on the side surfaces and the upper surface of the n-type semiconductor nanosheet 14 has a multilayer structure (in the present embodiment, two layers, i.e., light emitting layers 15A and 15B).

The semiconductor laser device 2 includes a gallium nitride (GaN) based material. In the semiconductor laser device 2, the substrate 11, the base layer 12, and the mask layer 13 are stacked in this order. The n-type semiconductor nanosheet 14 is provided on the base layer 12 to stand in a direction (the Y-axis direction) perpendicular to the base layer 12, and the light emitting layers 15A and 15B are provided around it. The light emitting layers 15A and 15B are provided between the barrier layer 16A and a barrier layer 16C, and between the barrier layer 16C and the barrier layer 16B, respectively. The barrier layer 16A, the barrier layer 16C, and the barrier layer 16B are provided in order from the n-type semiconductor nanosheet 14 side, for example. Further, the p-type semiconductor layer 17, the p-electrode 18, and the passivation film 19 are provided in this order around the barrier layer 16B covering the light emitting layer 15B. Note that, here, the barrier layer 16C provided between the light emitting layer 15A and the light emitting layer 15B includes, for example, undoped GaInN.

As described above, in the present embodiment, the light emitting layer 15 has a multilayer structure (for example, two layers (the light emitting layers 15A and 15B)). Thus, it is possible to further improve light emission efficiency, compared with the semiconductor laser device 1 in the first embodiment described above.

3. Third Embodiment

FIG. 10 schematically illustrates a cross-sectional configuration of a nitride semiconductor laser device (a semiconductor laser device 3) according to a third embodiment of the present disclosure. As with the semiconductor laser device 1 of the first embodiment described above, this semiconductor laser device 3 is, for example, a semiconductor laser (LD) that emits light having a wavelength that is longer than or equal to 200 nm and shorter than or equal to 1800 nm, in particular, in a visible range. The semiconductor laser device 3 of the present embodiment differs from the first embodiment described above in that the light emitting layer 15 provided on the side surfaces and the upper surface of the n-type semiconductor nanosheet 14 includes quantum dots.

The semiconductor laser device 3 includes a gallium nitride (GaN) based material. As described above, in the semiconductor laser device 3, the substrate 11, the base layer 12, and the mask layer 13 are stacked in this order. The n-type semiconductor nanosheet 14 is provided to stand on the base layer 12, and a light emitting layer 35 including quantum dots is provided around it. The light emitting layer 35 is provided between a barrier layer 36A and a barrier layer 36B. The barrier layer 36A and the barrier layer 36B are provided in order from the n-type semiconductor nanosheet 14 side, for example. Further, the p-type semiconductor layer 17, the p-electrode 18, and the passivation film 19 are provided in this order around the barrier layer 36B.

The quantum dots included in the light emitting layer 35 include, for example, AlGaInN. In the present embodiment, for example, a nanowire core including an n-type doped nitride-based III-V semiconductor is used. Thus, it is possible to provide the light emitting layer 35 having a uniform size and a uniform quantum dot distribution. The barrier layers 36A, 36B, 36C include undoped AlGaInN, for example.

As described above, in the present embodiment, the light emitting layer 35 includes quantum dots. Therefore, it is possible to reduce generation of dislocation, compared with the semiconductor laser device 1 in the first embodiment described above. Accordingly, it is possible to further improve light emission efficiency.

4. Fourth Embodiment

FIG. 11 schematically illustrates a cross-sectional configuration of a nitride semiconductor laser device (a semiconductor laser device 4) according to a fourth embodiment of the present disclosure. As with the semiconductor laser device 1 of the first embodiment described above, this semiconductor laser device 4 is, for example, a semiconductor laser (LD) that emits light having a wavelength that is longer than or equal to 200 nm and shorter than or equal to 1800 nm, in particular, in a visible range. The semiconductor laser device 4 of the present embodiment differs from the first embodiment described above in that the light emitting layer 15 provided on the side surfaces and the upper surface of the n-type semiconductor nanosheet 14 includes quantum dots and has a multilayer structure (in the present embodiment, two layers, i.e., light emitting layers 35A and 35B).

The semiconductor laser device 4 includes a gallium nitride (GaN) based material. As described above, in the semiconductor laser device 4, the substrate 11, the base layer 12, and the mask layer 13 are stacked in this order. The n-type semiconductor nanosheet 14 is provided to stand on the base layer 12, and the light emitting layers 35A and 35B including quantum dots are provided around it. The light emitting layers 35A and 35B are provided between barrier layers 36A, 36B, and 36C that are provided in order from the n-type semiconductor nanosheet 14 side, for example. Specifically, the light emitting layer 35A is provided between the barrier layer 36A and the barrier layer 36B, and the light emitting layer 35B is provided between the barrier layer 36B and the barrier layer 36C. Further, the p-type semiconductor layer 17, the p-electrode 18, and the passivation film 19 are provided in this order around the barrier layer 36C.

As described above, in the present embodiment, the light emitting layer 35 including the quantum dots has a multiple structure (for example, double (the light emitting layers 35A and 35B)). Accordingly, it is possible to further improve light emission efficiency, compared with the semiconductor laser device 3 in the third embodiment described above.

5. Modification 1

FIG. 12 schematically illustrates an example of a cross-sectional configuration of a nitride semiconductor laser device (a semiconductor laser device 5A) according to Modification 1 of the present disclosure. FIGS. 13 to 15 schematically illustrate other examples of the cross-sectional configuration of the nitride semiconductor laser device (semiconductor laser devices 5B, 5C, and 5D) according to the modification (Modification 1) of the present disclosure. As with the semiconductor laser device 1 of the first embodiment described above, these semiconductor laser devices 5A, 5B, 5C, and 5D are each, for example, a semiconductor laser (LD) that emits light having a wavelength that is longer than or equal to 200 nm and shorter than or equal to 1800 nm, in particular, in a visible range. The semiconductor laser devices 5A, 5B, 5C, and 5D of the present modification each differ from the first to the fourth embodiments described above in that the n-type semiconductor nanosheet 14 has a concentration gradient of n-type carriers in its growth direction (the Y-axis direction). The n-type semiconductor nanosheet 14 is provided on the base layer 12 and stands in a direction (the Y-axis direction) perpendicular to the base layer 12. In addition, the area of a side surface, of the n-type semiconductor nanosheet 14, extending in a longitudinal direction (the Z-axis direction) of the substrate 11 is greater than the area of an upper surface thereof.

The semiconductor laser devices 5A, 5B, 5C, and 5D each include a gallium nitride (GaN) based material. As described above, in each of the semiconductor laser devices 5A, 5B, 5C, and 5D, the substrate 11, the base layer 12, and the mask layer 13 are stacked in this order. The n-type semiconductor nanosheet 14 is provided to stand on the base layer 12, and the light emitting layer 15 is provided around it. The light emitting layer 15 is provided between the barrier layer 16A and the barrier layer 16B. The barrier layer 16A is provided on the n-type semiconductor nanosheet 14 side, for example. Further, the p-type semiconductor layer 17, the p-electrode 18, and the passivation film 19 are provided in this order around the barrier layer 16B covering the light emitting layer 15.

As described above, the n-type semiconductor nanosheet 14 of the present modification has a concentration gradient of n-type carriers in its growth direction. For example, the semiconductor laser device 5A illustrated in FIG. 12 and the semiconductor laser device 5B illustrated in FIG. 13 are each provided with the n-type semiconductor nanosheet 14 in which the dopant concentration of the n-type carriers increases in the growth direction thereof and an end thereof has the maximum concentration. Note that the dopant concentration of the n-type carriers may continuously vary as illustrated in FIG. 12, or may vary in a stepwise manner as illustrated in FIG. 13. Further, the semiconductor laser device 5C illustrated in FIG. 14 and the semiconductor laser device 5D illustrated in FIG. 15 are each provided with the n-type semiconductor nanosheet 14 having the minimum concentration or the maximum concentration of the dopants in the middle in its growth direction.

As described above, in the present modification, the n-type semiconductor nanosheet 14 having a concentration gradient of n-type carriers in the growth direction is provided. This makes it possible to improve n-type carrier transport efficiency, making it possible to further improve light emission efficiency.

6. Modification 2

FIGS. 16 and 17 each schematically illustrate a cross-sectional configuration of a nitride semiconductor laser device (a semiconductor laser device 6) according to Modification 2 of the present disclosure. FIG. 18 is a schematic perspective view of an overall configuration of the semiconductor laser device 6, for example, illustrated in FIG. 16. FIG. 16 illustrates a cross-sectional configuration of the vicinity of the p-electrode pad 21 (a diagram on the right in FIG. 16) together with the vicinity of the ridge section 10X (a diagram on the left in FIG. 16). FIG. 17 illustrates a cross-sectional configuration of the vicinity of an n-electrode pad 25 (a diagram on the right in FIG. 17) together with the vicinity of the ridge section 10X (a diagram on the left in FIG. 17). As with the first embodiment described above, this semiconductor laser device 6 is, for example, a semiconductor laser (LD) that emits light having a wavelength that is longer than or equal to 200 nm and shorter than or equal to 1800 nm, in particular, in a visible range. The semiconductor laser device 6 of the present modification differs from the first to the fourth embodiments and Modification 1 described above in that an n-electrode 54 is further provided on the upper surface of the n-type semiconductor nanosheet 14, and that the upper surface and a lower surface of the n-type semiconductor nano sheet 14 are sandwiched by n-type semiconductor layers. Both of side surfaces of the n-type semiconductor nanosheet 14 are provided with the barrier layer 16A, the light emitting layer 15, and the barrier layer 16B in this order.

The semiconductor laser device 6 includes a gallium nitride (GaN) based material. In the semiconductor laser device 6 of the present modification, the substrate 11, the base layer 12, and the mask layer 13 are stacked in this order. The n-type semiconductor nanosheet 14 is provided on the base layer 12 and stands in a direction perpendicular to the base layer 12. In addition, the area of the side surface, of the n-type semiconductor nano sheet 14, extending in the longitudinal direction of the substrate 11 is greater than the area of the upper surface thereof. On each of the side surfaces of the n-type semiconductor nanosheet 14, the barrier layer 16A, the light emitting layer 15, the barrier layer 16B, the p-type semiconductor layer 17, and the p-electrode 18 are stacked in this order. The p-electrode 18 is further provided continuously from a region on the p-type semiconductor layer 17 to a region on the mask layer 13.

In the semiconductor laser device 6 of the present modification, a mask layer 51 and a base layer 52 are provided in this order on an upper surface (a surface S3). The upper surface (the surface S3) is provided by the n-type semiconductor nanosheet 14, the light emitting layer 15, the barrier layers 16A and 16B, the p-type semiconductor layer 17, and the p-electrode 18. The base layer 52 is in contact with the n-type semiconductor nanosheet 14 through an opening 51H. The opening 51H is provided at a position opposing the n-type semiconductor nanosheet 14. The mask layer 51, end surfaces of the base layer 52, and the p-electrode 18 are covered with an interlayer insulating film 53. The n-electrode 54 is provided on the base layer 52. This n-electrode 54 is provided to extend from a region on the base layer 52 to a region on the interlayer insulating film 53, for example. The n-electrode pad 25 for drawing out the n-electrode 54 is provided on the n-electrode 54, for example, on the side of a ridge section 60X. The n-electrode pad 25 is electrically coupled to the n-electrode 54. The n-electrode 54 is covered with the passivation film 19. Note that, in addition to the n-electrode pad 25, the p-electrode pad 21 is provided on the side of the ridge section 60X, and the n-electrode 22 is provided on a lower surface (the surface 11S2) of the substrate 11, as in the first embodiment described above. The p-electrode pad 21 is electrically coupled to the p-electrode 18.

The semiconductor laser device 6 of the present modification can be manufactured, for example, as follows. FIGS. 19A, 19B, 19C, 19D, 19E, 19F, 19G, 19H, 19I, 19J, 19K, 19L, 19M, 19N, 19O, 19P, 19Q, and 19R illustrate a method of manufacturing the semiconductor laser device 6 in the order of processes.

First, by a method similar to that of the semiconductor laser device 1 in the first embodiment described above, a part up to the p-electrode 18 is formed as illustrated in FIG. 19A. Thereafter, as illustrated in FIG. 19B, a resist 63 is formed on the substrate 11 (specifically, on the p-electrode 18) except for the ridge section 60X.

Thereafter, as illustrated in FIG. 19C, the p-electrode 18, the p-type semiconductor layer 17, the barrier layers 16A and 16B, and the light emitting layer 15 are etched back, for example, by RIE. Thereby, the n-type semiconductor nanosheet 14 is exposed. In addition, the light emitting layer 15, the barrier layers 16A and 16B, the p-type semiconductor layer 17, and the p-electrode 18 provide the surface S3 where they have the identical plane.

Thereafter, as illustrated in FIG. 19D, the resist 63 is removed, following which, as illustrated in FIG. 19E, the mask layer 51 including, for example, SiO$_2$ is formed on the entire surface on the substrate 11 including the surface S3, for example, by a CVD method. Thereafter, as illustrated in FIG. 19F, a resist 64 is formed at a predetermined position of the mask layer 51 provided on the surface S3, following which, as illustrated in FIG. 19G, the mask layer 51 is patterned, for example, by RIE. Thereby, the mask layer 51 other than that on the ridge section 60X is removed, and the opening 51H is provided in the mask layer 51 on the ridge section 60X. The opening 51H allows the n-type semiconductor nanosheet 14 to be exposed.

Thereafter, as illustrated in FIG. 19H, a resist 65 having a plane same as that of the mask layer 51 is formed on the substrate 11 except for the ridge section 60X, following which an n-type AlGaInN film to be the base layer 52 is formed on the mask layer 51 and the resist 65, for example, by a CVD method. Thereafter, as illustrated in FIG. 19J, a resist 66 is formed on the n-type AlGaInN film to be the base layer 52 at a position corresponding to the ridge section 60X. Thereafter, as illustrated in FIG. 19K, the n-type AlGaInN film is patterned to form the base layer 52, following which, as illustrated in FIG. 19L, the resists 65 and 66 are removed.

Thereafter, as illustrated in FIG. 19M, for example, a silicon oxide film to be the interlayer insulating film 53 is formed on the entire surface of the substrate 11 including the upper surface and the side surfaces of the ridge section 60X. Thereafter, as illustrated in FIG. 19N, a resist 67 having a plane same as that of, for example, the base layer 52 is formed on the silicon oxide film except for the ridge section 60X. Thereafter, as illustrated in FIG. 19O, the silicon oxide film on the ridge section 60X is removed.

Thereafter, as illustrated in FIG. 19P, the resist 67 is removed, following which, as illustrated in FIG. 19Q, the n-electrode 54 covering the base layer 52 and the interlayer insulating film 53 is formed, for example, by an ALD method. Lastly, as illustrated in FIG. 19R, the passivation film 19 is formed on the n-electrode 54, for example, by a CVD method. Thus, the semiconductor laser device 6 illustrated in FIGS. 16, 17, and 18 is completed.

As described above, in the present modification, the upper surface and the lower surface of the n-type semiconductor nanosheet 14 are sandwiched by the n-type semiconductor layers (the base layer 12 and the base layer 52). Therefore, it is possible to improve a rate of an opening for injecting a current into the n-type semiconductor nanosheet 14. Accordingly, it is possible to further improve light emission efficiency, compared with the first embodiment described above.

7. Modification 3

FIG. 20 schematically illustrates an overall configuration of an array-shaped semiconductor laser device (a semiconductor laser stripe array 7) according to Modification 3 of the present disclosure. The semiconductor laser devices 1 to 6 referred to in the first to the fourth embodiments and Modifications 1 and 2 described above are able to be formed into a multi-laser, as illustrated in FIG. 20. This is achievable by providing the n-type semiconductor nanosheets 14 on the base layer 12 at predetermined intervals, and providing the light emitting layers 15 around them. The n-type semiconductor nanosheets 14 are each provided to stand in the direction (the Y-axis direction) perpendicular to the base layer 12.

The present disclosure has been described above with reference to the first to the fourth embodiments and Modifications 1 to 3; however, the present disclosure is not limited to the embodiments described above, and is modifiable in a variety of ways. For example, the components, the arrangement, the numbers, etc. of the semiconductor laser device exemplified in the embodiments and the like described above are mere examples. It is not necessary to provide all the components. Moreover, any other component may be further provided.

Note that the effects described herein are mere examples and are non-limiting. Further, any other effect may be achieved.

Note that the present disclosure may also have the following configurations. According to the present technology having the following configurations, a sheet-shaped structure is provided on a base layer in a direction perpendicular to the base layer. The base layer is provided on a single-crystal substrate. The sheet-shaped structure extends in a longitudinal direction of the single-crystal substrate. The sheet-shaped structure has an area of a side surface that is greater than an area of an upper surface. The sheet-shaped structure includes a resonator mirror on a pair of end surfaces that oppose each other in the longitudinal direction. The sheet-shaped structure includes a nitride semiconductor. A light emitting layer including a nitride semiconductor is provided at least on the side surface of the sheet-shaped structure. This reduces an influence of threading dislocation generated from the single-crystal substrate, the base layer, or the like on the light emitting layer, making it possible to improve light emission efficiency.

[1]
A nitride semiconductor laser device including:
a single-crystal substrate that extends in one direction;
a base layer provided on the single-crystal substrate and including a nitride semiconductor;
a sheet-shaped structure provided on the base layer to stand in a direction perpendicular to the base layer, the sheet-shaped structure having an area of a side surface that is greater than an area of an upper surface, the side surface extending in a longitudinal direction of the single-crystal substrate, the sheet-shaped structure including a nitride semiconductor;
a light emitting layer provided at least on the side surface of the sheet-shaped structure, the light emitting layer including a nitride semiconductor; and a resonator mirror provided by a pair of end surfaces of the sheet-shaped structure that oppose each other in the longitudinal direction.

[2]

The nitride semiconductor laser device according to [1] described above, in which a crystal structure of the nitride semiconductor included in the sheet-shaped structure is a wurtzite structure, and the light emitting layer is provided on a non-polar {11-20} plane of the side surface of the sheet-shaped structure or on a semipolar plane in a range of greater than or equal to −32 degrees and less than or equal to +32 degrees with respect to the non-polar {11-20} plane.

[3]

The nitride semiconductor laser device according to [1] or [2] described above, in which a crystal structure of the nitride semiconductor included in the sheet-shaped structure is a wurtzite structure, and the light emitting layer is provided on a non-polar {1-100} plane of the side surface of the sheet-shaped structure or on a semipolar plane in a range of greater than or equal to −28 degrees and less than or equal to +28 degrees with respect to the non-polar 11-1001 plane.

[4]

The nitride semiconductor laser device according to any one of [1] to [3] described above, in which a magnitude relationship between lattice constants of the base layer, the sheet-shaped structure, and the light emitting layer satisfies expressions (1) and (2) below, where $(a_x, c_x)$ are lattice constants of the nitride semiconductor included in the base layer, $(a_y, c_y)$ are lattice constants of the nitride semiconductor included in the sheet-shaped structure, and $(a_z, c_z)$ are lattice constants of the nitride semiconductor included in the light emitting layer, (math. 1) $a_x \leq a_y$      (1)

(math. 2) $c_y \leq c_z$      (2).

[5]

The nitride semiconductor laser device according to any one of [1] to [4] described above, in which a composition of the nitride semiconductor included in the base layer is $Al_{x1}Ga_{x2}In_{x3}N$, a composition of the nitride semiconductor included in the sheet-shaped structure is $Al_{y1}Ga_{y2}In_{y3}N$, and a composition of the nitride semiconductor included in the light emitting layer is $Al_{z1}Ga_{z2}In_{z3}N$, and In compositions in the base layer, the sheet-shaped structure, and the light emitting layer satisfy an expression (3) below, (math. 3) $Z3 > Y3 > X3 > 0$      (3)

(X1+X2+X3=1, Y1+Y2+Y3=1, Z1+Z2+Z3=1, 0≤{X1, X2, X3, Y1, Y2, Y3, Z1, Z2, Z3}≤1).

[6]

The nitride semiconductor laser device according to any one of [1] to [5] described above, in which the light emitting layer has a single layer.

[7]

The nitride semiconductor laser device according to any one of [1] to [5] described above, in which the light emitting layer has two or more layers.

[8]

The nitride semiconductor laser device according to any one of [1] to [5] described above, in which the light emitting layer has a single layer and includes quantum dots.

[9]

The nitride semiconductor laser device according to any one of [1] to [5] described above, in which the light emitting layer has two or more layers and includes quantum dots.

[10]

The nitride semiconductor laser device according to any one of [1] to [9] described above, in which the sheet-shaped structure has a dopant concentration that differs in accordance with a growth direction.

[11]

The nitride semiconductor laser device according to any one of [1] to [10] described above, in which the sheet-shaped structure has a dopant concentration that varies continuously in a growth direction.

[12]

The nitride semiconductor laser device according to any one of [1] to [10] described above, in which the sheet-shaped structure has a dopant concentration that varies in a stepwise manner in a growth direction.

[13]

The nitride semiconductor laser device according to any one of [1] to [10] described above, in which the sheet-shaped structure has a maximum dopant concentration at an end in a growth direction.

[14]

The nitride semiconductor laser device according to any one of [1] to [10] described above, in which the sheet-shaped structure has a maximum dopant concentration in middle in a growth direction.

[15]

The nitride semiconductor laser device according to any one of [1] to [14] described above, in which a light emission wavelength of the light emitting layer is longer than or equal to 200 nanometers and shorter than or equal to 1800 nanometers.

[16]

The nitride semiconductor laser device according to any one of [1] to [15] described above, in which the base layer and the light emitting layer each include an n-type nitride semiconductor, and a p-type nitride semiconductor layer and a p-type electrode are further provided in order around the light emitting layer.

[17]

The nitride semiconductor laser device according to [16] described above, in which the p-type electrode includes a transparent electrode.

[18]

A method of manufacturing a nitride semiconductor laser device, the method including:

providing a base layer on a single-crystal substrate that extends in one direction, the base layer including a nitride semiconductor;

forming a sheet-shaped structure in a direction perpendicular to the base layer, the sheet-shaped structure having an area of a side surface that is greater than an area of an upper surface, the side surface extending in a longitudinal direction of the single-crystal substrate, the sheet-shaped structure including a nitride semiconductor;

forming a light emitting layer at least on the side surface of the sheet-shaped structure, the light emitting layer including a nitride semiconductor; and forming a resonator mirror on a pair of end surfaces of the sheet-shaped structure that oppose each other in the longitudinal direction.

[19]

The method of manufacturing a nitride semiconductor laser device according to [18] described above, in which the sheet-shape structure is formed by providing a mask layer with an opening on the base layer and growing a crystal from the opening in a direction perpendicular to a surface of the base layer.

[20]

The method of manufacturing a nitride semiconductor laser device according to [18] or [19], in which the resonator mirror is formed by cleaving or dry etching.

This application claims the benefit of Japanese Priority Patent Application JP2018-216957 filed with the Japan Patent Office on Nov. 20, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A nitride semiconductor laser device, comprising:
a single-crystal substrate that extends in one direction;
a base layer on the single-crystal substrate, wherein the base layer includes a nitride semiconductor;
a sheet-shaped structure on the base layer to stand in a direction perpendicular to the base layer, wherein
the sheet-shaped structure has an area of a side surface that is greater than an area of an upper surface,
the side surface extends in a longitudinal direction of the single-crystal substrate,
the sheet-shaped structure includes a nitride semiconductor, and
a dopant concentration of the sheet-shaped structure differs based on a growth direction;
a light emitting layer at least on the side surface of the sheet-shaped structure, wherein the light emitting layer includes a nitride semiconductor; and
a resonator mirror that comprises a pair of end surfaces of the sheet-shaped structure, wherein a first end surface of the pair of end surfaces is opposite to a second end surface of the pair of end surfaces in the longitudinal direction.

2. The nitride semiconductor laser device according to claim 1, wherein
a crystal structure of the nitride semiconductor included in the sheet-shaped structure is a wurtzite structure, and
the light emitting layer is on a non-polar {11-20} plane of the side surface of the sheet-shaped structure or on a semipolar plane in a range of greater than or equal to −32 degrees and less than or equal to +32 degrees with respect to the non-polar {11-20} plane.

3. The nitride semiconductor laser device according to claim 1, wherein
a crystal structure of the nitride semiconductor included in the sheet-shaped structure is a wurtzite structure, and
the light emitting layer is on a non-polar {1-100} plane of the side surface of the sheet-shaped structure or on a semipolar plane in a range of greater than or equal to −28 degrees and less than or equal to +28 degrees with respect to the non-polar {1-100} plane.

4. The nitride semiconductor laser device according to claim 1, wherein
a magnitude relationship between lattice constants of the base layer, lattice constants of the sheet-shaped structure, and lattice constants of the light emitting layer satisfies expressions (1) and (2),
(ax, cx) are the lattice constants of the nitride semiconductor included in the base layer, (ay, cy) are the lattice constants of the nitride semiconductor included in the sheet-shaped structure, and (az, cz) are the lattice constants of the nitride semiconductor included in the light emitting layer, $$ax \leq ay \tag{1}$$

$$cy \leq cz \tag{2}.$$

5. The nitride semiconductor laser device according to claim 1, wherein
a composition of the nitride semiconductor included in the base layer is $Al_{x1}Ga_{x2}In_{x3}N$, a composition of the nitride semiconductor included in the sheet-shaped structure is $Al_{y1}Ga_{y2}In_{y3}N$, and a composition of the nitride semiconductor included in the light emitting layer is $Al_{z1}Ga_{z2}In_{z3}N$, and
In compositions in the base layer, the sheet-shaped structure, and the light emitting layer satisfy an expression (3), $$Z3 > Y3 > X3 > 0 \tag{3}$$

(X1+X2+X3=1, Y1+Y2+Y3=1, Z1+Z2+Z3=1, 0≤{X1, X2, X3, Y1, Y2, Y3, Z1, Z2, Z3}≤1).

6. The nitride semiconductor laser device according to claim 1, wherein the light emitting layer has a single layer.

7. The nitride semiconductor laser device according to claim 1, wherein the light emitting layer has at least two layers.

8. The nitride semiconductor laser device according to claim 1, wherein the light emitting layer has a single layer and includes quantum dots.

9. The nitride semiconductor laser device according to claim 1, wherein the light emitting layer has at least two layers and includes quantum dots.

10. The nitride semiconductor laser device according to claim 1, wherein the dopant concentration of the sheet-shaped structure varies continuously in the growth direction.

11. The nitride semiconductor laser device according to claim 1, wherein the dopant concentration of the sheet-shaped structure varies in a stepwise manner in the growth direction.

12. The nitride semiconductor laser device according to claim 1, wherein the dopant concentration of the sheet-shaped structure is maximum at an end in the growth direction.

13. The nitride semiconductor laser device according to claim 1, wherein the dopant concentration of the sheet-shaped structure is maximum in middle in the growth direction.

14. The nitride semiconductor laser device according to claim 1, wherein a light emission wavelength of the light emitting layer is longer than or equal to 200 nanometers and shorter than or equal to 1800 nanometers.

15. The nitride semiconductor laser device according to claim 1, wherein
each of the base layer and the light emitting layer includes an n-type nitride semiconductor, and
the nitride semiconductor laser device further includes a p-type nitride semiconductor layer and a p-type electrode in order in a vicinity of the light emitting layer.

16. The nitride semiconductor laser device according to claim 15, wherein the p-type electrode comprises a transparent electrode.

17. A method of manufacturing, comprising:
in a nitride semiconductor laser device:
providing a base layer on a single-crystal substrate that extends in one direction, the base layer including a nitride semiconductor;

forming a sheet-shaped structure in a specific direction perpendicular to the base layer, the sheet-shaped structure having an area of a side surface that is greater than an area of an upper surface, the side surface extending in a longitudinal direction of the single-crystal substrate, the sheet-shaped structure including a nitride semiconductor;

forming a light emitting layer at least on the side surface of the sheet-shaped structure, the light emitting layer including a nitride semiconductor, wherein the sheet-shaped structure has a dopant concentration that differs in accordance with a growth direction; and forming a resonator mirror on a pair of end surfaces of the sheet-shaped structure, wherein a first end surface of the pair of end surfaces is opposite to a second end surface of the pair of end surfaces in the longitudinal direction.

18. The method of manufacturing according to claim 17, further comprising providing a mask layer with an opening on the base layer and growing a crystal from the opening in the specific direction perpendicular to a surface of the base layer.

19. The method of manufacturing according to claim 17, further comprising the resonator mirror by cleaving or dry etching.

* * * * *